United States Patent
Vaudo et al.

(10) Patent No.: US 9,190,592 B2
(45) Date of Patent: Nov. 17, 2015

(54) THIN FILM THERMOELECTRIC DEVICES HAVING FAVORABLE CRYSTAL TILT

(71) Applicant: Nextreme Thermal Solutions, Inc., Durham, NC (US)

(72) Inventors: Robert P. Vaudo, Cary, NC (US); Philip A. Deane, Durham, NC (US); Thomas Peter Schneider, Durham, NC (US); Christopher D. Holzworth, Morrisville, NC (US); Joseph Robert Williamson, Apex, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 76 days.

(21) Appl. No.: 13/833,651

(22) Filed: Mar. 15, 2013

(65) Prior Publication Data
US 2014/0124010 A1    May 8, 2014

Related U.S. Application Data

(60) Provisional application No. 61/722,946, filed on Nov. 6, 2012.

(51) Int. Cl.
*H01L 35/34* (2006.01)
*H01L 35/04* (2006.01)
*H01L 35/32* (2006.01)

(52) U.S. Cl.
CPC ............ *H01L 35/04* (2013.01); *H01L 35/32* (2013.01); *H01L 35/34* (2013.01)

(58) Field of Classification Search
CPC ......... H01L 35/32; H01L 35/28; H01L 35/34; H01L 35/00
USPC ............. 136/200, 238, 240; 438/54, 55, 102, 438/103, 602–606; 427/78; 117/953, 954, 117/88–93, 101
See application file for complete search history.

(56) References Cited

U.S. PATENT DOCUMENTS 6,815,244 B2 * 11/2004 Bottner et al. ............ 438/54
7,804,019 B2 9/2010 Pierce et al.
(Continued)

FOREIGN PATENT DOCUMENTS

JP     2004296629 A    10/2004
JP     2009182142 A    8/2009
WO    WO2011135432 A1 11/2011

OTHER PUBLICATIONS

Merriam-Webster, on-line dictionary, definition of coalesce (http://www.merriam-webster.com/dictionary/coalesce), downloaded Mar. 18, 2015.*
(Continued)

*Primary Examiner* — Jayne Mershon
(74) *Attorney, Agent, or Firm* — Myers Bigel Sibley & Sajovec, PA

(57) ABSTRACT

A method of fabricating a thermoelectric device includes providing a substrate having a plurality of inclined growth surfaces protruding from a surface thereof. Respective thermoelectric material layers are grown on the inclined growth surfaces, and the respective thermoelectric material layers coalesce to collectively define a continuous thermoelectric film. A surface of the thermoelectric film opposite the surface of the substrate may be substantially planar, and a crystallographic orientation of the thermoelectric film may be tilted at an angle of about 45 degrees or less relative to a direction along a thickness thereof. Related devices and fabrication methods are also discussed.

27 Claims, 19 Drawing Sheets

(56) References Cited

U.S. PATENT DOCUMENTS

| | | | |
|---|---|---|---|
| 2004/0108205 A1* | 6/2004 | Larsen | 204/290.01 |
| 2008/0185030 A1* | 8/2008 | Pierce et al. | 136/203 |
| 2009/0199887 A1* | 8/2009 | Johnson et al. | 136/239 |
| 2010/0252087 A1 | 10/2010 | Deane et al. | |
| 2011/0062446 A1 | 3/2011 | Goyal | |

OTHER PUBLICATIONS

Notification of Transmittal of the International Search Report and the Written Opinion of the International Searching Authority, or the Declaration, in corresponding PCT Application No. PCT/US2013/068501 mailed Feb. 19, 2014 (19 pages).

S. Adashi and K. Oe, "Chemical Etching Characteristics of (001) GaAs", Journal of Electrochemical Society, vol. 130, No. 12, pp. 2427-2434, 1983.

D.W.Shaw, Journal of Electrochemical Society, vol. 128, 1981, pp. 874.

K. Eberl*, *M. Lipinski, H. Schuler*, "Atomic layer in situ etching and MBE regrowth", Journal of Crystal Growth 201/202 (1999) 568-573.

* cited by examiner

⟨⟨⟨ EPI(N-TYPE AND/OR P-TYPE) WITH TILTED C-PLANE

/// SUBSTRATE FOR EPI GROWTH (SACRIFICIAL FOR MODULE BUILD); TILTED FACETS NOT SHOWN

☐ SOLDER METALS

\\\\ HEADER 1 WITH METALIZATIONS

/// HEADER 2 WITH METALIZATIONS

THIN FILM THERMOELECTRIC DEVICES HAVING FAVORABLE CRYSTAL TILT

CLAIM OF PRIORITY

The present application claims priority from U.S. Provisional Patent Application No. 61/722,946 entitled "Thin Film Thermoelectric Devices Having Favorable Crystal Tilt" filed on Nov. 6, 2012, the disclosure of which is hereby incorporated by reference herein in its entirety.

FIELD OF THE INVENTION

The present invention relates to thin film thermoelectric materials and related fabrication methods.

BACKGROUND

Thermoelectric materials may be used to provide cooling and/or power generation according to the Peltier effect. Application of solid state thermoelectric cooling may be expected to improve the performance of electronics, photonics and sensors such as, for example, RF receiver front-ends, processors, programmable gate arrays, infrared (IR) imagers, laser diodes, light-emitting diodes, ultra-sensitive magnetic signature sensors, and/or superconducting electronics.

Traditional thermoelectric devices may be fabricated by assembling arrays of P and N thermoelectric elements (TE), as shown in perspective and cross-sectional views in FIGS. 27A and 27B, respectively. The TEs may be soldered to top and bottom high thermal conductivity substrates or headers. The headers may be oriented parallel to each other and may "sandwich" the TEs. Electrically conductive traces may be formed on the top and bottom headers and may form a series electrical circuit with alternating P and N elements. In this structure, the electrical current in the TEs and the flow of heat through the elements may both be substantially normal to the orientation of the headers, as shown in FIG. 27B.

The performance of a thermoelectric device may be a function of the figure(s)-of-merit (ZT) of the thermoelectric material(s) used in the device, with the figure-of-merit being given by:

$$ZT = (\alpha^2 T \sigma / K_T), \quad \text{(equation 1)}$$

where $\alpha$, $T$, $\sigma$, $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density (d) and the corresponding $\alpha$, yielding equation (2) below:

$$Z = \alpha^2 \sigma / (K_L + K_e) = \alpha^2 / [K_L / (\mu d q) + L_0 T)], \quad \text{(equation 2)}$$

where, $L_0$ is the Lorenz number. State-of-the-art thermoelectric devices may use alloys, such as p-$Bi_xSb_{2-x}Te_{3-y}Se_y$ ($x \approx 0.5$, $y \approx 0.12$) and n-$Bi_2(Se_yTe_{1-y})_3$ ($y \approx 0.05$) for the 200 degree K to 400 degree K temperature range. For certain alloys, $K_L$ may be reduced more strongly than $\mu$ leading to enhanced ZT. Also, $DT_{max}$ (or $\Delta T_{max}$) is another figure of merit for thermoelectric modules, and can be defined as the maximum operating temperature difference between the higher temperature side ("hot" side) and lower temperature side ("cold" side) of the thermoelectric film when no heat load is applied. An optimal current ($I_{max}$) is applied to achieve this maximum cooling. $DT_{max}$ is defined with the hot (heat rejection) side held at a fixed temperature. When the heat load is increased from zero, the operating temperature difference, $\Delta T$, is reduced. The $\Delta T$ is reduced to zero at a specific heat load, referred to as $Q_{max}$, which is quantified in watts. This is the maximum amount of heat that can be pumped by the thermoelectric device at a given temperature. Maximum heat pumping density is the $Q_{max}$ per unit area of the device ($Q_{max}/A$).

In bulk thermoelectric materials, the c-axis of the crystal may have a high degree of tilt, such that, when thermoelectric modules are fabricated from the bulk materials, the heat/electrical conduction path may be substantially aligned with the direction of lowest resistivity in the bulk material. However, thinning of high tilt bulk material can be difficult, as the material is typically not durable enough to withstand the thinning process for thicknesses less than about 100 μm.

Controlled growth of thin-film thermoelectric materials has been developed. For example, V-VI based films, such as bismuth telluride ($Bi_2Te_3$) and/or antimony telluride ($Sb_2Te_3$)-based epitaxial films grown on gallium arsenide (GaAs) substrates, may be used in the fabrication of thin-film thermoelectrics. For thin film processes, the c-axis of the crystal is typically grown with a nearly 0 degree angle with respect to a perpendicular to the growth surface. As such, when thermoelectric modules are fabricated from thin-film thermoelectric materials, the heat/electrical conduction path may be substantially normal or perpendicular to the substrate growth surface, and substantially parallel to the growth direction. Some tilt in the c-axis of the thermoelectric film can be introduced by using an epitaxial growth process (such as metal-organic chemical vapor deposition (MOCVD) or molecular beam epitaxy (MBE)) and providing an offcut substrate surface, as described, for example, in commonly-owned U.S. Pat. No. 7,804,019 to Pierce et al.

SUMMARY

According to some embodiments of the present invention, a method of fabricating a thermoelectric device includes providing a substrate having a plurality of inclined growth surfaces protruding from a surface thereof. Respective thermoelectric material layers are grown on the inclined growth surfaces. The respective thermoelectric material layers coalesce to collectively define a continuous thermoelectric film. In some embodiments, the thermoelectric film may have a macroscopically planar surface having a thickness variation of less than about 20% over 1 millimeter.

In some embodiments, the thermoelectric film may have a crystallographic orientation that is tilted at an angle of about 45 degrees or more relative to the substantially planar surface of the thermoelectric film, or a crystallographic orientation that is tilted at an angle of about 45 degrees or less relative to a direction along the thickness of the thermoelectric film.

In some embodiments, a plane defined by the crystallographic orientation of the thermoelectric film may include a direction of lowest resistivity, lowest ρK product, highest ZT, and/or highest $DT_{max}$ in the thermoelectric film.

In some embodiments, the respective thermoelectric material layers may have a higher rate of growth on crystal planes exposed by the inclined growth surfaces than on the crystal plane corresponding to the surface of the substrate from which the inclined growth surfaces protrude.

In some embodiments, the inclined growth surfaces may include surfaces that are tilted at angles of about 45 degrees or less relative to a direction perpendicular to the surface of the substrate. The surface of the substrate may extend along a crystallographic orientation of the substrate. In some embodiments, a crystallographic orientation of the surface of the substrate may define or may be near a {100} plane.

In some embodiments, ones of the respective thermoelectric material layers on substantially parallel ones of the inclined growth surfaces may coalesce to define a plurality of substantially uniform (homogenous) crystallographic orientations that are tilted at respective angles of about 45 degrees or less, about 36 degrees or less, or about 15 degrees or less, relative to the direction along the thickness of the thermoelectric film.

In some embodiments, ones of the respective thermoelectric material layers on adjacent ones of the inclined growth surfaces may coalesce to define a plurality of non-uniform crystallographic orientations, where at least half of the plurality of non-uniform crystallographic orientations are tilted at respective angles of about 45 degrees or less, about 36 degrees or less, or about 15 degrees or less, relative to the direction along the thickness of the thermoelectric film.

In some embodiments, adjacent ones of the inclined growth surfaces may define opposing sidewalls of respective trenches in the surface of the substrate. In some embodiments, the trenches may extend in a direction substantially parallel to an <010> direction.

In some embodiments, the respective thermoelectric material layers may be selectively grown on one of the opposing sidewalls of the respective trenches. The respective thermoelectric material layers may coalesce to define a plurality of substantially uniform crystallographic orientations in the thermoelectric film that are tilted at respective angles of about 45 degrees or less relative to a direction along the thickness thereof. Selective growth may be achieved where one of the opposing sidewalls is inclined at a greater angle than another, where the other one of the sidewalls is masked to prevent growth thereon, and/or where the substrate is offcut to encourage growth on one of the sidewalls.

In some embodiments, the trenches may be formed by a combination of sequentially-performed wet and dry etching processes. For example, the trenches may be formed by etching the surface of the substrate using a dry etchant to define preliminary trenches therein, and then etching the preliminary trenches using a wet etchant comprising an isotropic component to define the respective trenches. In some embodiments, the plurality of inclined growth surfaces may be created by chemical (wet and/or dry) etching, other physical, electrical, optical, electrochemical, and/or other methods of patterning or otherwise modifying the growth substrate surface or intermediate material layer.

In some embodiments, the opposing sidewalls of the trenches may be rounded in shape to expose a range of crystallographic orientations.

In some embodiments, the opposing sidewalls of the trenches may expose or comprise some (101) and (10$\bar{1}$) planes, respectively.

In some embodiments, the opposing sidewalls of the trenches may expose or comprise some (001) and (00$\bar{1}$) planes, respectively.

In some embodiments, an intermediate material layer may be deposited on the inclined growth surfaces prior to growing the respective thermoelectric layers thereon. The intermediate material layer may have a thickness of less than about 500 Angstroms (Å). In some embodiments, the intermediate material layer may include transition metals such as Scandium, Titanium, Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Lanthanum, Hafnium, Tantalum, Tungsten, Rhenium, Osmium, Iridium, Platinum, Gold, and/or Mercury and/or alloys thereof. The intermediate material layer may also include metal oxides such as silicon dioxide ($SiO_2$), indium tin oxide (ITO), etc.

In some embodiments, the inclined growth surfaces may define peaks that protrude from the surface of the substrate by about 0.1 micrometers or more, or by about 0.5 micrometers or more.

In some embodiments, a pitch between adjacent peaks may be about 2 micrometers or less, or about 0.1 micrometers to about 10 micrometers.

In some embodiments, after growing the respective thermoelectric material layers on the inclined growth surfaces, the substrate may be removed such that a surface of the thermoelectric film opposite the substantially planar surface thereof includes a plurality of inclined features protruding therefrom.

In some embodiments, the thermoelectric film may be assembled between first and second thermally conductive headers to define a path of thermal conduction between the substantially planar surface and the surface opposite thereto. In some embodiments, the substantially planar surface of the thermoelectric film and/or the surface opposite thereto may be planarized (or further planarized) prior to assembly between the first and second headers.

In some embodiments, the thermoelectric film may be a Group V-VI material, a Group III-V material, a Group II-VI material, or other material having anisotropic thermoelectric properties.

In some embodiments, the thermoelectric film may be a compound comprising bismuth (Bi), antimony (Sb), lead (Pb), tellurium (Te), and/or selenium (Se).

In some embodiments, the substrate may be silicon (Si), gallium arsenide (GaAs), barium fluoride (BaF), silicon carbide (SiC), gallium nitride (GaN), aluminum nitride (AlN), sapphire, and/or glass.

According to other embodiments of the present invention, a method of fabricating a thermoelectric device includes forming an intermediate layer on a growth surface of the substrate, where the intermediate layer is configured to alter one or more surface characteristics of the growth surface, and forming a thermoelectric film on the intermediate layer, wherein the thermoelectric film has a thickness of less than about 50 µm and a crystallographic orientation that is tilted at an angle of about 45 degrees or less relative to a direction along the thickness thereof. The growth surface may be one of a plurality of inclined growth surfaces protruding from the substrate, and the inclined growth surfaces may be tilted at an angle of about 45 degrees or more relative to a surface of the substrate, or 45 degrees or less relative to a direction perpendicular to the surface of the substrate.

According to further embodiments of the present invention, a thermoelectric device includes a thermoelectric film element having a crystallographic orientation that is tilted at an angle of about 45 degrees or less relative to a direction along a thickness of the thermoelectric element between opposing surfaces thereof. The thickness of the thermoelectric element is less than about 100 micrometers, and may be about 50 micrometers or less, or about 35 micrometers or less.

In some embodiments, one or both of the opposing surfaces of the thermoelectric element is substantially planar.

In some embodiments, the other of the opposing surfaces of the thermoelectric element includes a plurality of inclined surfaces protruding therefrom, wherein the inclined surfaces are tilted at an angle of about 45 degrees or less relative to the direction along the thickness thereof.

In some embodiments, a plane defined by the crystallographic orientation of the thermoelectric element may include a direction of lowest resistivity in the thermoelectric element. As such, an electrical resistivity of the thermoelectric element in a direction substantially perpendicular to the opposing surfaces thereof may be less than an electrical resistivity of the thermoelectric element in a direction substantially parallel to the opposing surfaces thereof.

In some embodiments, the crystallographic orientation of the thermoelectric element may be tilted at an angle of less than about 35 degrees relative to the direction along the thickness thereof (or greater than about 55 degrees relative to a surface thereof).

In some embodiments, the crystallographic orientation of the thermoelectric element may be tilted at an angle of less than about 15 degrees relative to the direction along the thickness thereof.

In some embodiments, the thermoelectric element may include bismuth telluride, and a plane defined by the crystallographic orientation may include an ab-direction.

In some embodiments, the thermoelectric element may include a plurality of non-uniform crystallographic orientations. At least half of the plurality of orientations may be tilted at respective angles of about 45 degrees or less, 35 degrees or less, or 15 degrees or less, relative to the direction along the thickness thereof.

In some embodiments, the thermoelectric element may include a plurality of substantially uniform crystallographic orientations that are tilted at respective angles of about 45 degrees or less, 35 degrees or less, or 15 degrees or less, relative to the direction along the thickness thereof.

In some embodiments, the thermoelectric element may be an n-type or a p-type thermoelectric element. In some embodiments, the thermoelectric film may be an n-type element and the device may further include a p-type thermoelectric element having a crystallographic orientation that is tilted at an angle of about 45 degrees or less relative to a direction along a thickness between opposing surfaces thereof, and having a thickness of less than about 100 micrometers. The n-type and p-type thermoelectric elements may be electrically coupled in series and may be thermally coupled in parallel between conductive headers to provide thermal conduction along the direction of the respective thicknesses thereof.

In some embodiments, the n-type element and the p-type element have a substantially similar resistance along the respective thicknesses thereof.

According to still further embodiments of the present invention, a thermoelectric module includes first and second thermally conductive headers, and a thermoelectric film element a thickness of about 100 micrometers or less and having opposing first and second surfaces mounted on the first and second thermally conductive headers, respectively. An electrical resistivity of the thermoelectric element in a direction substantially perpendicular to the opposing surfaces thereof is less than an electrical resistivity of the thermoelectric element in a direction substantially parallel to the opposing surfaces thereof.

In some embodiments, the element has a thickness between the opposing first and second surfaces of less than about 50 micrometers, or less than about 30 micrometers.

In some embodiments, the thermoelectric element includes a Group V-VI material, a Group III-V material, or a Group II-VI material having anisotropic thermoelectric properties.

In some embodiments, the element comprises an n-type element or a p-type element of a thermoelectric module. The element has a dimension along the direction substantially parallel to the opposing surfaces thereof of greater than about 50 micrometers, greater than about 100 micrometers, greater than about 200 micrometers, or greater than about 500 micrometers.

In some embodiments, the thermoelectric module is configured to provide a $DT_{max}$ between the opposing first and second surfaces of greater than about 55 degrees Celsius, greater than about 60 degrees Celsius, or greater than about 65 degrees Celsius with the hot side of the device held at about 30 degrees Celsius or less, or a $DT_{max}$ of greater than about 65 degrees Celsius or greater than about 70 degrees Celsius with the hot side of the device held at about 85 degrees Celsius or less. In some embodiments, the thermoelectric module may be configured to provide a $DT_{max}$ between the opposing first and second surfaces of greater than about 60 degrees Celsius or greater than about 65 degrees Celsius with the hot side of the device held at about 120 degrees Celsius or less.

In some embodiments, the thermoelectric module may be configured to provide a $Q_{max}/A$ of greater than about 30 W/cm$^2$ or greater than about 70 W/cm$^2$ with the hot side of the device held at about 30 degrees Celsius, of greater than about 50 W/cm$^2$ with the hot side of the device held at about 85 degrees Celsius, or of greater than about 55 W/cm$^2$ with the hot side of the device held at about 120 degrees Celsius.

In some embodiments, the thermoelectric module is configured to provide a $DT_{max}$ between the opposing first and second surfaces of greater than about 55 degrees Celsius and $Q_{max}/A$ of greater than about 30 W/cm$^2$ or greater than about 70 W/cm$^2$ with the hot side of the device held at about 30 degrees Celsius or less, or a $DT_{max}$ of about 60 degrees Celsius or greater and $Q_{max}/A$ of greater than about 50 W/cm$^2$ with the hot side of the device held at about 85 degrees Celsius or less. In some embodiments, the thermoelectric module may be configured to provide a $DT_{max}$ between the opposing first and second surfaces of about 60 degrees Celsius or greater and $Q_{max}/A$ of greater than about 55 W/cm$^2$ with the hot side of the device held at about 120 degrees Celsius or less.

In some embodiments, one of the opposing first and second surfaces of the thermoelectric element includes a plurality of inclined surfaces protruding therefrom. The inclined surfaces are tilted at an angle of about 45 degrees or less relative to the direction substantially perpendicular to the opposing surfaces thereof.

In some embodiments, the first and/or second surfaces can be planarized or roughened to increase surface area and reduce contact resistance.

According to yet further embodiments, a thermoelectric element having opposing first and second surfaces is mounted on the first and second thermally conductive headers, respectively. The thermoelectric element has a thickness of less than about 50 μm between the opposing first and second surfaces thereof and is configured to provide a $DT_{max}$ of greater than about 60 degrees Celsius therebetween when one of the first and second surfaces is held at a temperature of at most about 30 degrees Celsius or at most about 85 degrees Celsius.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 1A:
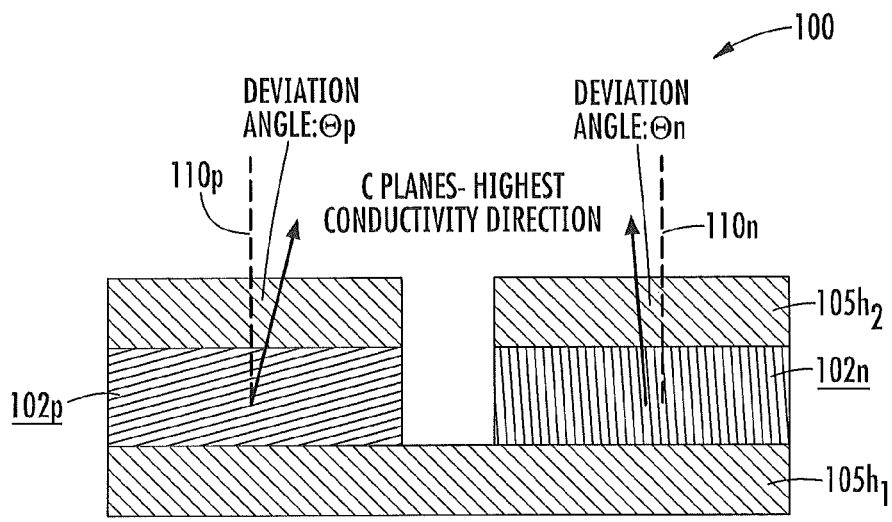
FIG. 1A is a cross sectional view of a thermoelectric module including thin film thermoelectric elements in accordance with embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element or layer, or intervening elements or layers may be present. In contrast, when an element or layer is referred to as being "directly on," "directly connected to" or "directly coupled to" another element or layer, there are no intervening elements or layers present. In no event, however, should "on" or "directly on" be construed as requiring a layer to cover an underlying layer. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

While some embodiments are described below with reference to metal organic chemical vapor deposition (MOCVD), it is to be understood that other methods of thermoelectric film deposition may also be used in embodiments of the present invention. For instance, molecular beam epitaxy (MBE), thermal or e-beam evaporation, sputtering, vapor phase epitaxy, liquid phase epitaxy, electrochemical deposition, alternate layer epitaxy, laser ablation, and/or other techniques used for thin film crystal growth or other seeded growth techniques may be used.

Crystallographic orientation in thermoelectric films and/or growth substrates according to some embodiments of the present invention is described herein with reference to Miller indices. As used herein, Miller indices in square brackets, such as [100], denote a direction, while Miller indices in angle brackets or chevrons, such as <100>, denote a family of directions that are equivalent due to crystal symmetry. For example, <100> refers to the [100], [010], [001] directions and/or the negative of any of these directions, noted as the [$\bar{1}$00], [0$\bar{1}$0], [00$\bar{1}$] directions (where negative terms in Miller indices are noted with a bar over the number that is negative). Miller indices in parentheses, such as (100), denote a plane. The normal to the (100) plane is the direction [100]. Miller indices in curly brackets or braces, such as {100}, denote a family of planes that are equivalent due to crystal symmetry, in a manner similar to the way angle brackets denote a family of directions. For hexagonal crystals, a similar terminology is used, but refer to the a, b and c hexagonal direction as described below.

Figure 24A:
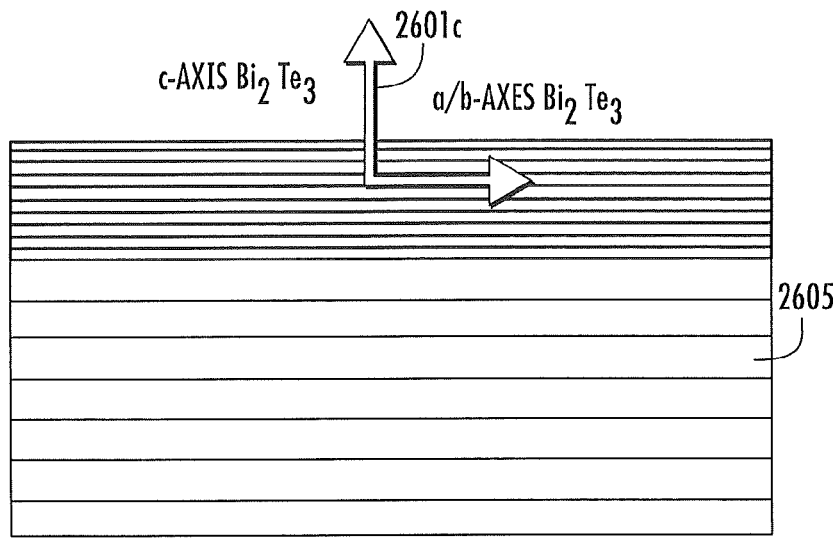
FIGS. 24A-24B are cross sectional views illustrating conventional V-VI thin film modules.
Figure 24B:
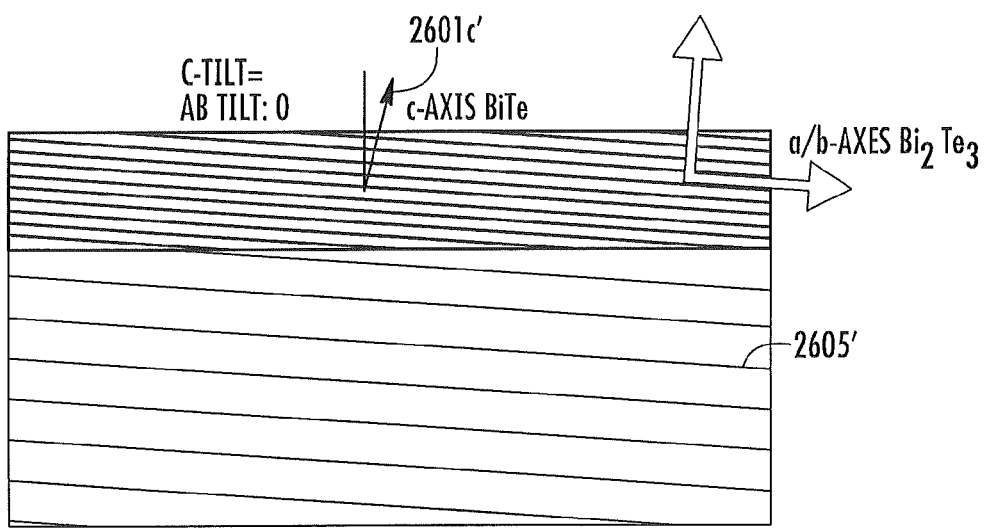
Figure 24C:
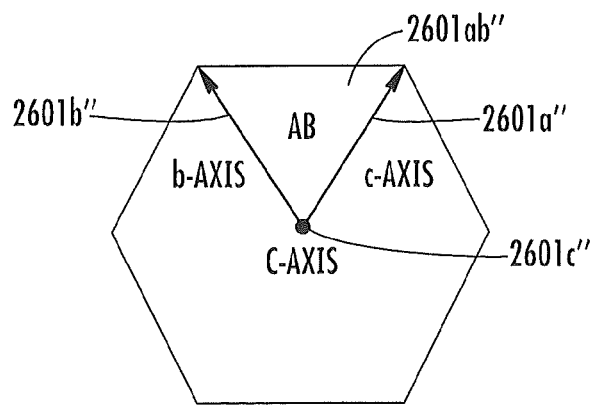
FIG. 24C illustrates relative orientations of planes and directions of a hexagonal crystal structure.
Figure 25A:
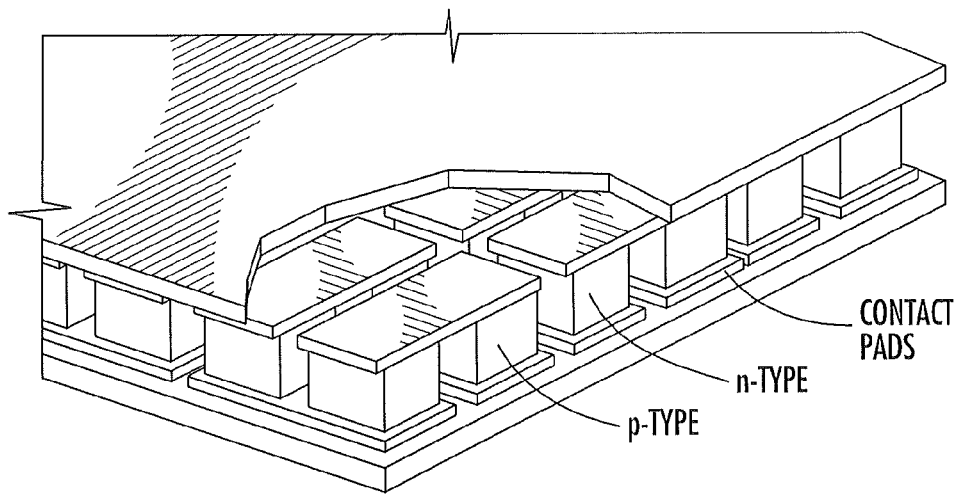
FIG. 25A is a perspective view and FIG. 25B is a cross sectional view illustrating arrays of p- and n-type thermoelectric elements in conventional thermoelectric devices.
Figure 25B:
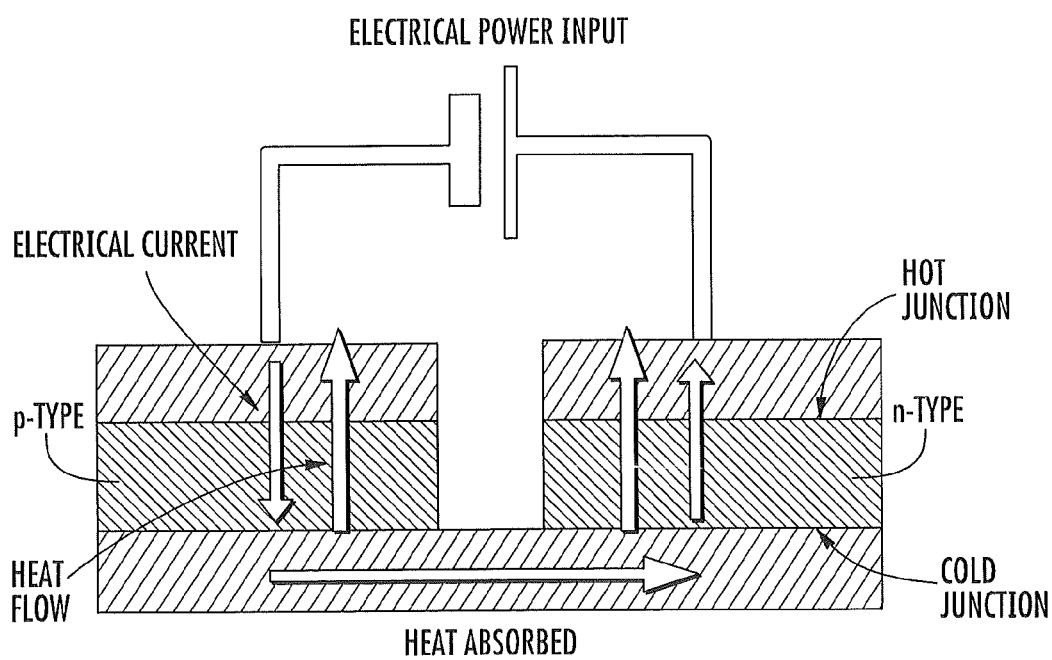

Some embodiments of the present invention arise from realization that, in V-VI materials, resistivity and thermal conductivity are strongly anisotropic, with the following approximate relationships:

$$\rho_{ab} = \frac{\rho_c}{4};$$ (equation 3; equation 4)
$$K_{ab} = 2 \cdot K_c$$

where a, b, and c indicate respective crystallographic axes, ρ is the electrical resistivity, and K is the thermal conductivity. As a result, improved or optimal thermoelectric performance may be obtained with the lower resistivity C-planes most closely aligned with the electrical and heat flow directions in the module (that is, with the c-axis perpendicular to the electrical and heat flow directions). However, V-VI thin film modules as grown on most substrates may be conventionally oriented with the c-axis predominantly aligned to the electrical and heat flow direction (as shown by the c-axis 2601c on substrate 2605 in FIG. 24A) or with a relatively small degree (for example, less than 30°) of tilt (as shown by the c-axis 2601c' on substrate 2605' in FIG. 24B), that is, such that the C-planes (indicated by hatched lines) are perpendicular to the electrical and heat flow directions, which may be less than optimal in terms of thermoelectric performance. As shown in FIG. 24C with reference to a hexagonal crystal structure, the c-axis 2601c" (extending into/out of the plane of the figure) is perpendicular to the a- and b-axes 2601a" and 2601b", and is thus perpendicular to the AB plane 2601ab" (which contains both the a-axis and the b-axis). In some embodiments described herein, the AB plane may also be referred to as a C-plane, and thus, the c-axis/direction extends normal or perpendicular to the C-plane (e.g., directions and planes that are normal to one another may be similarly denoted).

Application of tensor rotations of the principle material coordinates for the primary material parameters can estimate the impact of C-tilt or AB-tilt (used herein to refer to the crystallographic tilt or inclination of the C- (or AB-) crystal planes with respect to a horizontal or lateral surface of the film, or conversely, with respect to a direction of thermal or electrical conduction over the thickness of the film) on material parameters and device level $DT_{max}$. As used herein, $DT_{max}$ (or $\Delta T_{max}$) designates the temperature difference between the higher temperature side ("hot" side) and lower temperature side ("cold" side) of the thermoelectric film. More particularly, $DT_{max}$ (or $\Delta T_{max}$) is the figure of merit for thermoelectric modules defined as the maximum operating temperature difference across a module when no heat load is applied. The optimal current ($I_{max}$) is applied to achieve this maximum cooling. $DT_{max}$ is defined with the hot (heat rejection) side held at a fixed temperature (typically $T_{Hot}$=about 30 or less, or about 85° C. or less, but it can be defined at any temperature). $Q_{max}$ is the maximum amount of heat that can be pumped by the thermoelectric device at a given temperature. Maximum heat pumping density is the $Q_{max}$ per unit area of the device ($Q_{max}/A$). $Q_{max}/A$ is inversely proportional to the thickness of the thermoelectric elements.

The methods/material described with respect to some embodiments of the present invention may enable improvement in one or more of the above-described parameters to levels not yet seen for thin film thermoelectric devices. For example, $DT_{max}$ of greater than about 55-60° C. at $T_{Hot}$=about 30° C. or less may be enabled, or $DT_{max}$ of greater than about 70° C. at $T_{Hot}$=about 85° C. or less may be enabled. In some embodiments, $DT_{max}$ of greater than about 65° C. at $T_{Hot}$=about 30° C. or less; or $DT_{max}$ of greater than about 75° C. at $T_{Hot}$=about 85° C. or less; or $DT_{max}$ of greater than about 60° C. at $T_{Hot}$=about 120° C. or less may be enabled. By virtue of achieving high $DT_{max}$ with low element thickness (for example, <100 μm, <50 μm, or <35 μm), some embodiments of the present invention may also enable a much greater maximum heat pumping density ($Q_{max}/A$) than other devices that can be made with high $DT_{max}$ values. In some embodiments, the thermoelectric module is configured to provide a $DT_{max}$ between the opposing first and second surfaces of greater than about 55 degrees Celsius and $Q_{max}/A$ of greater than about 30 W/cm² or greater than about 70 W/cm² with the hot side of the device held at about 30 degrees Celsius or less, or a $DT_{max}$ of greater than about 60 degrees Celsius or greater and $Q_{max}/A$ of greater than about 50 W/cm² with the hot side of the device held at about 85 degrees Celsius or less. In some embodiments, the thermoelectric module may be configured to provide a $DT_{max}$ between the opposing first and second surfaces of greater than about 60 degrees Celsius or greater and Qmax/A of greater than about 55 W/cm² with the hot side of the device held at about 120 degrees Celsius or less.

Figure 1B:
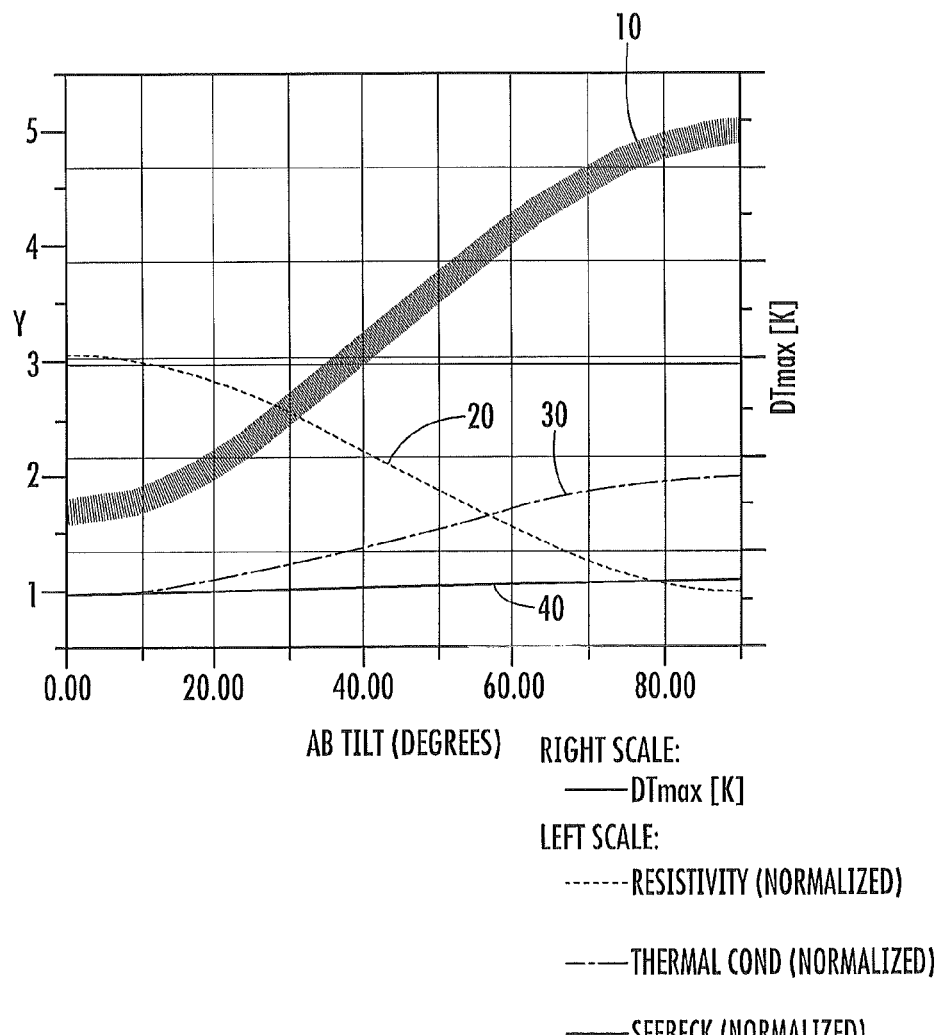
FIG. 1B is a graph illustrating the influence of the tilt of the C-plane on thermoelectric properties of thermoelectric thin films in accordance with some embodiments of the present invention.

As such, significant gains in thermoelectric performance can be achieved by increasing the AB-tilt relative to the horizontal, or conversely reducing the AB-tilt relative to the direction of heat/electrical flow, as shown in the graph of FIG. 1B. In particular, FIG. 1B illustrates that as the tilt of the AB-plane increases relative to the horizontal, electrical resistivity 20 of the thermoelectric film is reduced, thermal conductivity 30 is increased, and the Seebeck coefficient 40 is substantially unchanged. Furthermore, the electrical resistivity 20 decreases at a greater rate than the thermal conductivity 30 increases. $DT_{max}$ is dependent on these fundamental material parameters as $DT_{max} = \alpha^2 Tc^2/2\rho K$, where $\alpha$ is the Seebeck coefficient, Tc is the cold side temperature, $\rho$ is the electrical resistivity, and K is the thermal conductivity. Since the electrical resistivity in the heat flow direction is decreased by more than the thermal conductivity is increased by increasing the tilt, the product of the electrical resistivity and thermal conductivity ($\rho K$) is reduced and the thermoelectric performance increases (as indicated by a higher ZT and $DT_{max}$ 10) as tilt of the AB-plane approaches 90 degrees relative to a horizontal surface of the thermoelectric film, and may achieve a maximum $DT_{max}$ when the AB-plane is aligned with direction of thermal or electrical conduction in the film. In other words, increased thermoelectric performance may be provided by increasing the tilt of the lowest-resistivity AB-plane (e.g., the C-plane as referred to hereinafter) relative to the laterally-extending film surface, that is, such that an electrical resistivity (or $\rho K$) along a thickness of the film (e.g., the direction of thermal conduction therein when provided in a thermoelectric module) is less than an electrical resistivity (or $\rho K$) along a direction that is substantially perpendicular to the thickness.

Accordingly, embodiments of the present invention provide thin film thermoelectric (TE) elements, modules and systems where the C-plane of the TE element is more closely aligned with the electrical and heat flow directions in the TE element. In particular, as shown in FIG. 1A, N-type elements 102n and/or P-type elements 102p of a thermoelectric module or device 100 have improved alignment of the C-planes (indicated by hatched lines) with the heat/electrical flow directions 110n, 110p compared with standard thermoelectric thin films. In some embodiments, the deviation angles $\Theta p$ and/or $\Theta n$ (or perhaps effective deviation angle if more than one tilt is present) may be less, than 45 degrees, and even less than 25 degrees, relative to the direction of heat/electrical flow 110p and/or 110n in the device. As further shown in FIG. 1A, both n-type and p-type elements 102n and 102p are placed between metalized ceramic headers $105h_1$, $105h_2$ to provide a thermoelectric module 100 with thermoelectric elements 102n and 102p that are connected electrically in series, and thermally in parallel between the headers $105h_1$, $105h_2$. In particular, the n-type and p-type elements 102n and 102p are packaged between the headers $105h_1$, $105h_2$ such that their lateral surfaces (e.g. surfaces that are perpendicular to the thicknesses thereof) extend along the surfaces of the headers $105h_1$, $105h_2$. In thin film thermoelectric elements described herein, the thermoelectric elements 102n and 102p have a thickness of less than about 100 micrometers (μm), and in some embodiments 50 μm or less.

Thus, in thermoelectric modules described herein, the N-type and/or P-type elements have improved alignment of the C-planes with the heat/electrical flow direction between the headers compared with standard thermoelectric thin films. Thin film thermoelectric elements in accordance with some embodiments described herein may thus provide a $DT_{max}$ of greater than about 60, which is similar to that of bulk thermoelectric elements, but over a thickness of 50 μm or less.

In order to increase the C-plane tilt in thermoelectric films described herein, embodiments of the present invention may use wafer patterning, dry etching, wet etching and/or facet coatings to create highly inclined surfaces for growth of $(Bi_xSb_{1-x})_2(Te_{1-y}Se_y)_3$ (or other thermoelectric materials) with increased tilt of the favorable C-crystal planes. Example thermoelectric film fabrication processes on an example growth substrate are described below; it will be understood that many compatible growth substrates may be used. In addition, it will be understood that embodiments of the present invention may use other techniques to pattern or texture the growth substrate to include a plurality of inclined facets/growth surfaces that enable increased tilt of the crystallographic orientations (also referred to as crystallographic tilt) of the thermoelectric material. Therefore, in addition to wet and/or dry etching, other chemical, electrochemical, physical, electrical, optical and/or other means of shaping or otherwise modifying the growth substrate surface to achieve a pattern or texture that includes high inclined growth surfaces are included in the embodiments described herein.

Alternately or additionally, textured layers may be provided on the growth substrate to create high inclined growth surfaces in accordance with some embodiments described herein. In addition, any combination of these with or without the use of surface changing intermediate layers (as described below with reference to FIGS. 11-13) is also included in embodiments of the present invention. As described in greater detail below, the surface changing layer(s), may also create favorable conditions for growth of thermoelectric materials with increased incline and/or may induce a plurality of inclined growth surfaces to increase the crystal tilt of the thermoelectric materials. The inclined growth surfaces may be intentionally added to the surface changing media via chemical, electrochemical, physical, electrical, optical or other means and/or may be inherent to the method of deposition or growth of the surface changing layer.

In addition, some embodiments herein are described with reference to trenches. In practice, these trenches, which include the inclined growth surfaces, may take on various shapes including striped, rectangular, circular, and/or hexagonal features. The trenches can be defined in specific locations or be self-arranging and random in nature, so long as inclined facets are generated that enable coalescence of the thermoelectric film into planar layers with favorable crystal tilt.

FIGS. 2A to 5B illustrate methods of fabricating thin-film thermoelectric devices according to some embodiments of the present invention. In particular, FIGS. 2A-4A illustrate a substrate 205a including a surface 215a along (e.g., aligned with) the (100) crystal plane (also referred to herein as a (100) surface), in which protruding facets or sidewall surfaces 220a comprising the (101), (10$\bar{1}$), and (100) crystal planes are formed. FIGS. 2B-4B illustrate a substrate 205b including a macroscopic surface 215b substantially parallel to the (100) crystal plane, in which trenches having facets or sidewall surfaces 220b (for example, including the {110} and {111} crystal planes are formed. In FIGS. 2A-4B, the facets 220a, 220b are inclined by about 45 degrees or more relative to the (100) surface 215a, 215b of the substrate 205b. More generally, in accordance with embodiments of the present invention, a surface for a thermoelectric film may be etched or otherwise patterned to create inclined growth surfaces (also referred to herein as inclined facets) that are ready for TE crystal growth. The inclined facets/surfaces 220a, 220b may protrude from the surface of the substrate by about 0.1 micrometers (m) or more. In some embodiments, the inclined surfaces may define triangular or "peaked" features that protrude from the substrate by about 0.1 µm to about 5 µm.

Figure 2A:
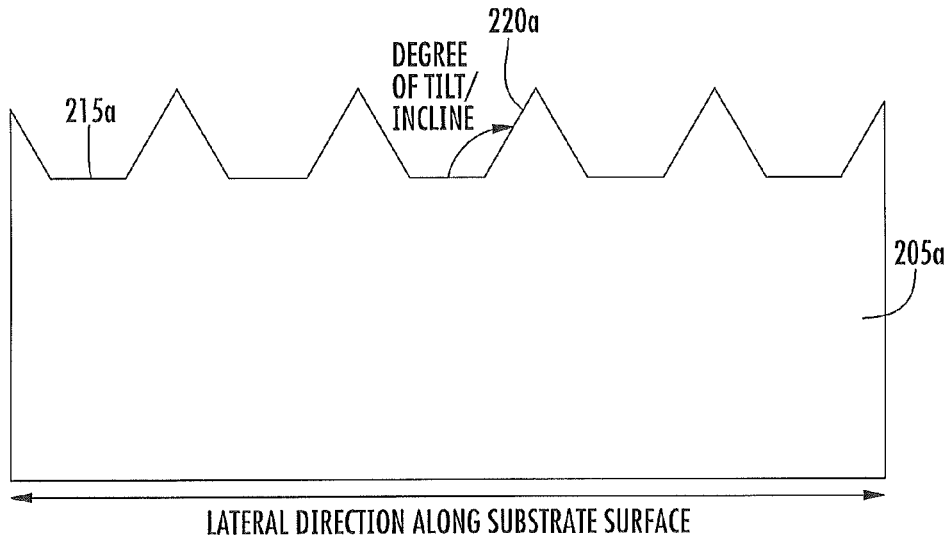
FIGS. 2A to 5B are cross-sectional views illustrating methods of forming inclined growth surfaces and depositing thin-film thermoelectric materials in accordance with some embodiments of the present invention.
Figure 2B:
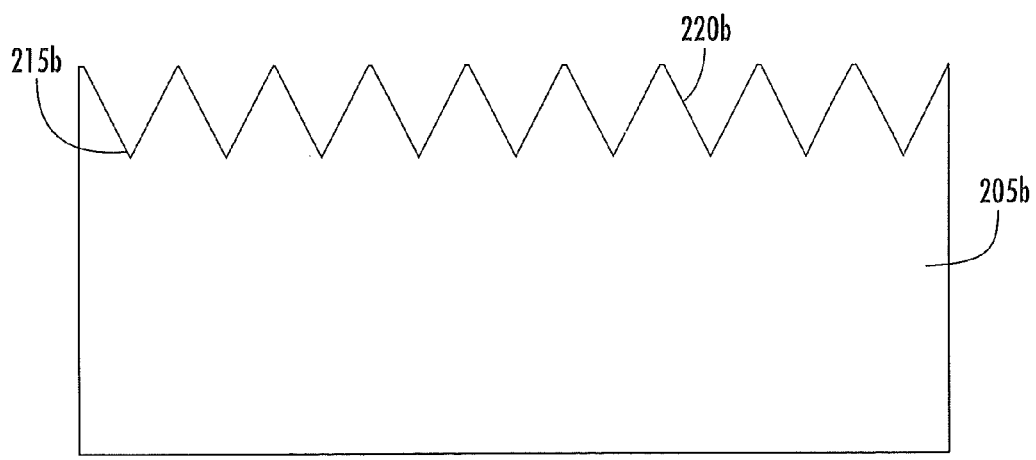

In the examples of FIGS. 2A and 2B, a substrate 205a, 205b is patterned using a mask (for example, photoresist, $SiO_2$, $Si_3N_4$, etc.) to define inclined growth surfaces 220a, 220b protruding from the substrate surface 215a, 215b. For example, an anisotropic chemical etch can be used to expose inclined growth surfaces 220a, 220b in the substrate 205a, 205b. The particular crystallographic planes defined or exposed by the facets or surfaces 220a, 220b may depend on the orientation of the stripes or other patterns in the mask, as well as the etch chemistry. Any masking technique that allows for the use of etching to reveal inclined growth surfaces in the underlying substrate, including self-aligned methods, may be used. In some embodiments, the substrates or wafers described herein may refer to silicon (Si), gallium arsenide (GaAs), barium fluoride (BaF), silicon carbide (SiC), gallium nitride (GaN), aluminum nitride (AlN), sapphire, and/or glass. Referenced crystal planes generally refer to cubic system indices, but other comparable planes are intended for hexagonal or other crystal structures.

Referring now to FIGS. 3A-4B, a thin-film thermoelectric material 302, 402 is deposited on the inclined growth surfaces. For example, MOCVD or MBE may be used to deposit V-VI thin films, such as bismuth telluride ($Bi_2Te_3$), with increased tilt of the C crystal planes. Epitaxial growth, whereby a thin film thermoelectric material may register to the underlying inclined growth surface without necessarily following the same tilt or structure, may be used. Epitaxial growth conditions which favor one or more of the (111), (101), and (110) inclined growth surfaces (e.g., conditions that provide higher nucleation or growth rate on such facets) and limit growth in the bottom of the trenches and (100) facets may be used. For example, during the growth of $(Bi_x Sb_{1-x})_{2x}Te_3$ alloys on a substrate with inclined facets, larger growth temperatures, larger Te flux, and/or lower Sb fluxes help to preferentially nucleate the higher tilt surfaces over the lower tilt surfaces. In addition or alternatively, substrate offcut or masking can be used to reduce or prevent growth on one surface and favor growth on one "side" (that is, preferential or selective growth on a particular facet or sidewall surface) for better coalescence.

Figure 3A:
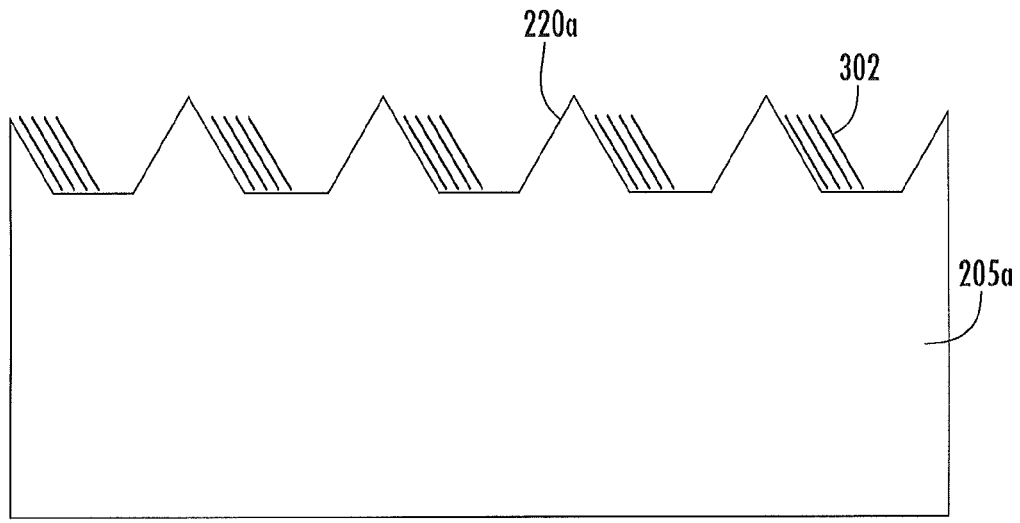
Figure 3B:
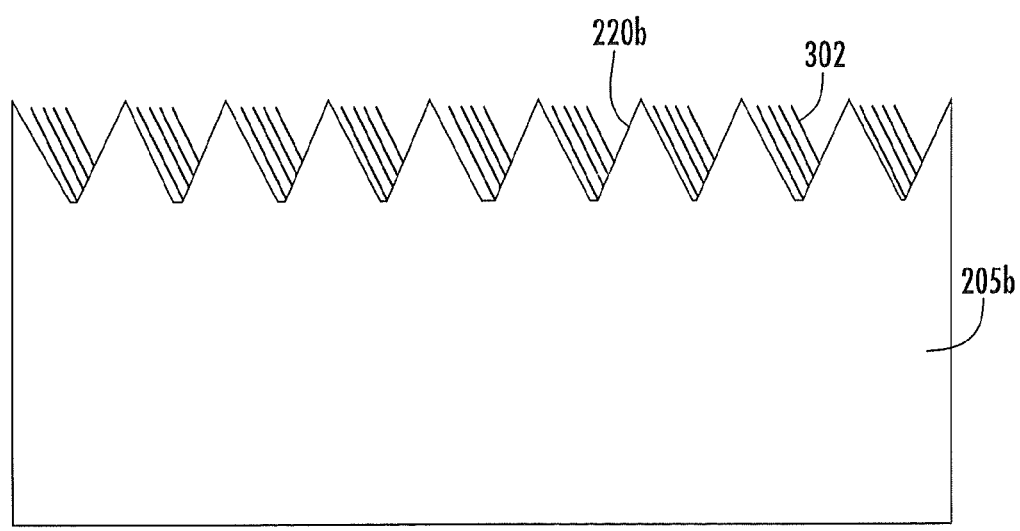
Figure 4A:
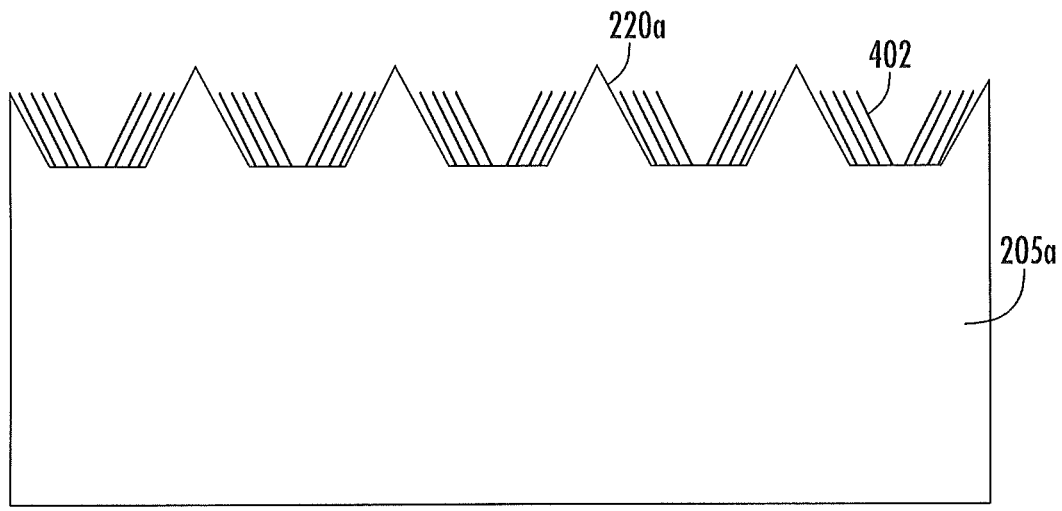
Figure 4B:
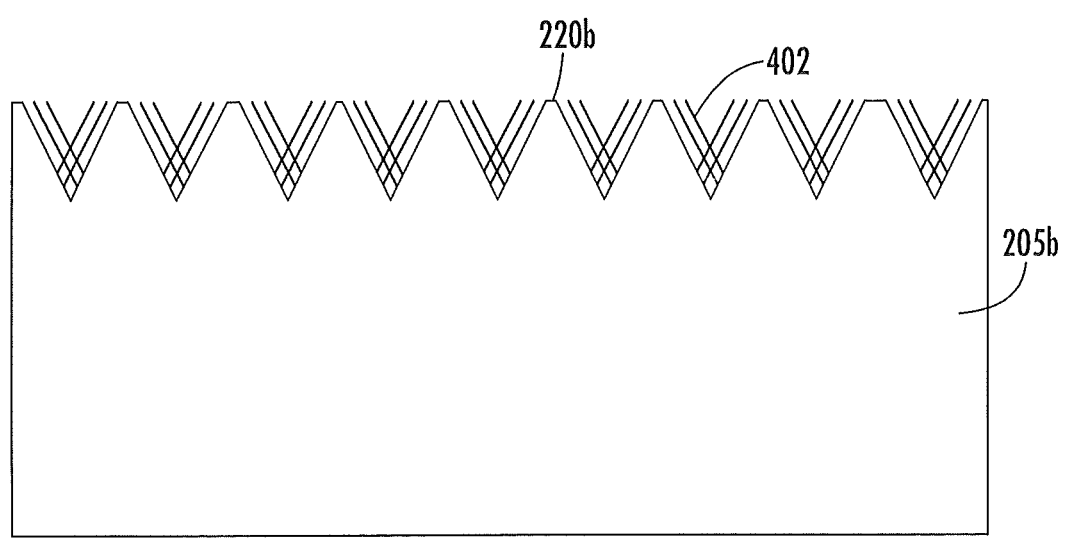

For example, FIGS. 3A and 3B illustrate V-VI thin film growth 302 preferentially nucleating on a particular facet (the left one of the sidewalls 220a, 220b of each trench) due to masking or less favorable growth surfaces. Even a slight tilt or asymmetry (e.g., 2 degrees) of one inclined surface relative to another may be sufficient to encourage preferential growth on that inclined surface. However in other embodiments; growth may be permitted or encouraged on both sidewall surfaces/facets 220a, 220b of the trenches. For example, FIGS. 4A and 4B illustrate V-VI thin film growth 402 nucleating on both inclined growth surfaces/trench sidewalls 220a, 220b. The crystallographic orientations of the grown thin films 302, 402 are indicated by the indicated by hatched lines shown in FIGS. 3A-4B, and the tilt of the crystallographic orientations may be influenced by inclined growth surfaces 220a, 220b.

Figure 5A:
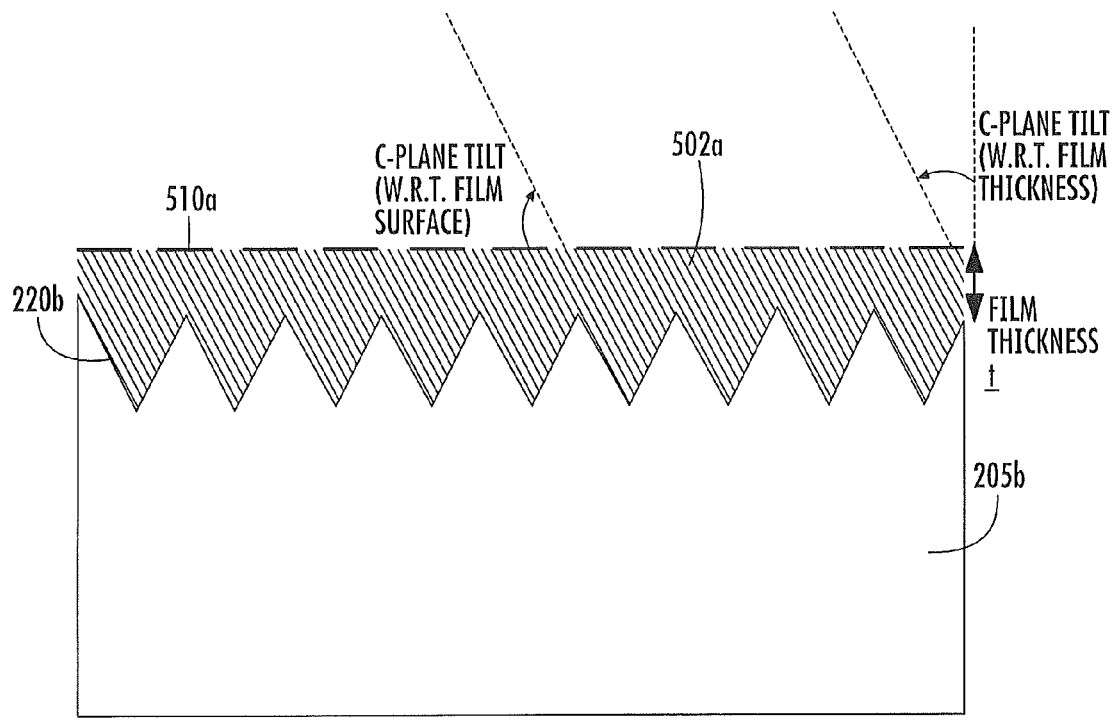
Figure 5B:
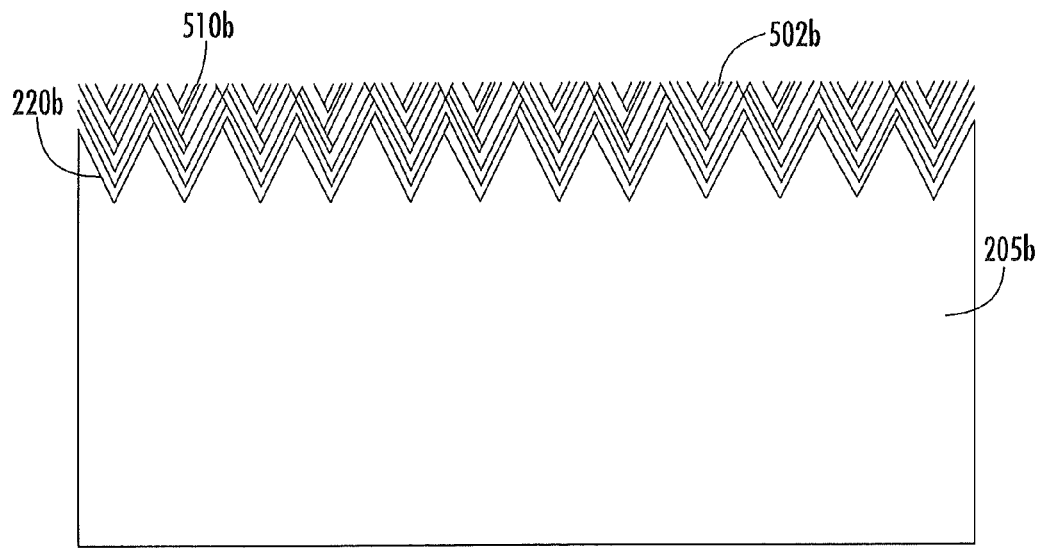

FIGS. 5A and 5B illustrate growth of a V-VI epitaxial film 502a, 502b in trenches having facets/inclined sidewall surfaces 220b aligned with or otherwise including {110} and {111} crystal planes. The V-VI epi growth continues to fill the trenches until growth on adjacent facets/growth planes coalesce, resulting in V-VI thermoelectric film 502a, 502b having a substantially planar surface 510a, 510b. As such, the V-VI layers formed on separate growth sites 220b coalesce to collectively define a continuous thermoelectric film 502a, 502b, which may or may not include cracks or microcracks therein. The C-plane of the thermoelectric film 502a, 502b has a crystallographic orientation (indicated by the hatched lines) that is tilted at an angle of about 45 degrees or more relative to the surface of the growth substrate (or about 45 degrees or less relative to a direction of thermal or electrical conduction along the thickness of the film 502a, 502b when implemented in a thermoelectric module).

In particular, FIG. 5A illustrates continuation of epi-growth and coalescence predominantly on one of the {110} and {111} facets 220b initiated in FIG. 3B, resulting in a thermoelectric film 502a having substantially homogeneous crystallographic tilts. FIG. 5B illustrates continuation of epi-growth and coalescence from the competing {110} and {111} facets 220b initiated in FIG. 4B, resulting in a thermoelectric film 502b having inhomogeneous crystallographic tilts, with an overall average incline of about 45 degrees or more relative to a (100) plane defined by the surface of the growth substrate. In FIG. 5B, competing growth between adjacent epi growth planes can coalesce or knit together to define the substantially planar surface of the V-VI film 502b by (for example): (i) growth on one surface overtaking another and growth on parallel surfaces or facets growing together; (ii) growth on two adjacent surfaces or facets mixing or stabilizing each other; or (iii) a combination of (i) and (ii). The coalescence tilt of the C-planes may be achieved without the use of a subsequent heat treatment process. The coalesced film 502a, 502b may be substantially planar (for example, having a variation in thickness t, as measured from the surface to the peak of the facet, of less than about 20% over the grown film), and may thus define a continuous layer that is durable to handling in subsequent thin-film thermoelectric module fabrication processes as described below.

Although described above with reference to particular substrates and inclined growth surface orientations, other substrates and/or inclined growth surfaces may also be used. However, it will be understood that not all such orientations will necessarily result in epitaxial film coalescence in accordance with embodiments of the present invention as described herein.

Figure 6A:
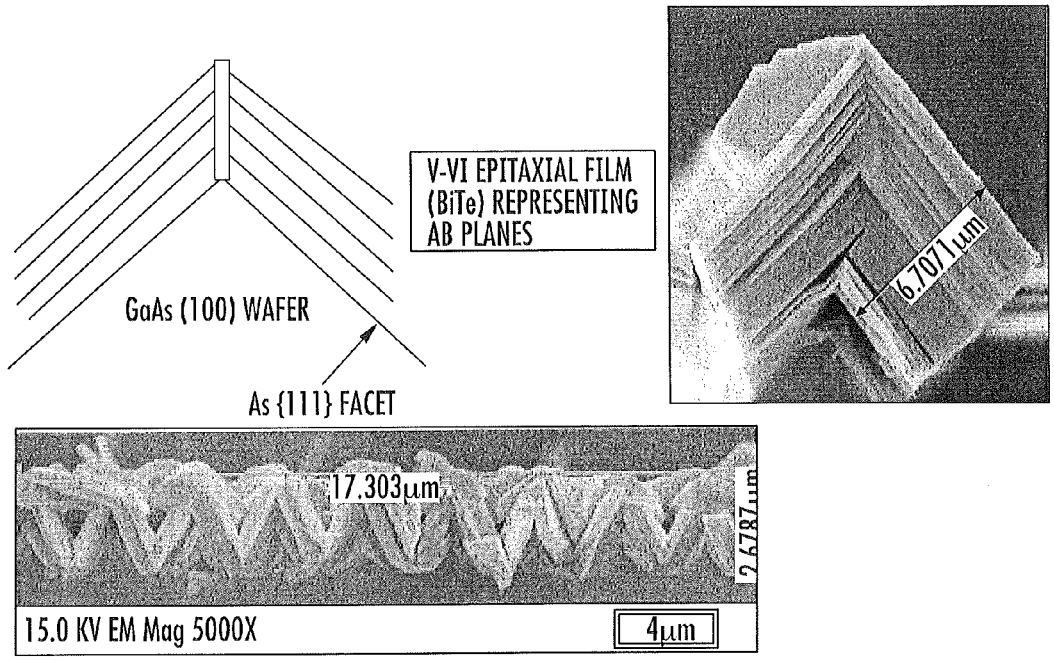
FIGS. 6A-6B are cross-sectional views illustrating problems encountered in fabrication of thin-film thermoelectric materials on inclined growth surfaces.
Figure 6B:
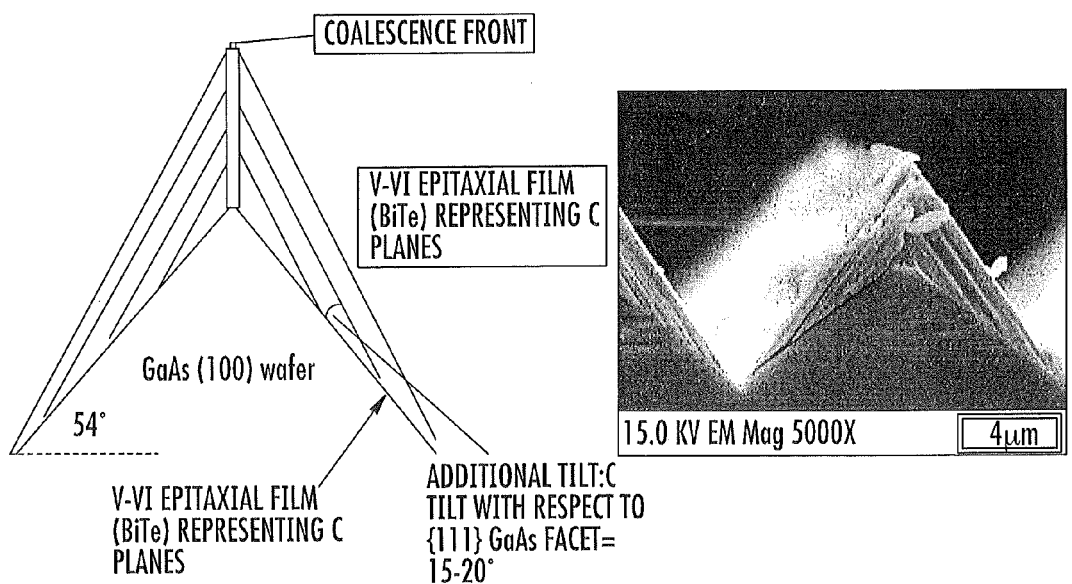

For example, FIGS. 6A and 6B illustrate some inclined growth surface orientations that do not result in epitaxial film coalescence, in contrast to the inclined growth surfaces used by some embodiments of the present invention. As shown in FIGS. 6A and 6B, inclined growth surfaces similar to those shown in the embodiment of FIGS. 2A to 5B are formed in a surface of a (100) substrate, but the inclined growth surfaces extend along {111} crystal planes. For example, the {111} facets may be sidewalls of trenches that are formed by anisotropic wet etching the (100) substrate using a mask that exposes elongated areas or "stripes" in the surface extending parallel to the [0$\bar{1}$1] direction. Since the V-VI film growth is epitaxial, lattice alignment of the thermoelectric film relative to the substrate impacts growth.

In particular, in the example of FIG. 6A for $Bi_2Te_3$ epitaxial growth on (100) GaAs substrates, the stripes are oriented parallel to the <011> direction, such that etching reveals Arsenic facets that comprise {111} planes. The C-planes of the grown $Bi_2Te_3$ film are tilted by greater than about 45 degrees relative to the (100) GaAs substrate surface. However, as shown in the photographs of FIG. 6A, the $Bi_2Te_3$ films grown on adjacent facets may not coalesce; thus, the inclined growth surfaces of FIG. 6A may not be conducive to the growth of thermoelectric films according to embodiments of the present invention described herein.

Similarly, in the example of FIG. 6B, the stripes are oriented parallel to the <01$\bar{1}$> direction, such that etching reveals Gallium facets that comprise {111} planes. The {111} planes defined or exposed by the facets are tilted by about 55 degrees relative to the (100) GaAs substrate surface, resulting in additional inclination (of about 15-20 degrees) of the C-planes of the grown $Bi_2Te_3$ film with respect to the {111} GaAs facets. Again, however, as shown in the photographs of FIG. 6B, the $Bi_2Te_3$ films grown on adjacent facets may not coalesce; thus, the inclined growth surfaces of FIG. 6B may likewise not be conducive to the growth of thermoelectric films according to embodiments of the present invention described herein.

Figure 6C:
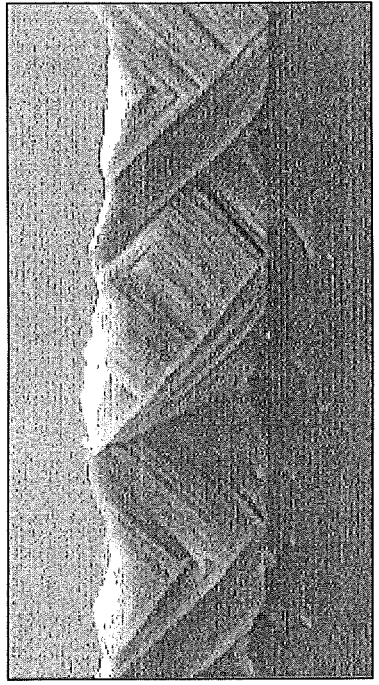
FIGS. 6C-6D are cross-sectional views illustrating fabrication of thin-film thermoelectric materials on inclined growth surfaces in accordance with other embodiments of the present invention.
Figure 6C:
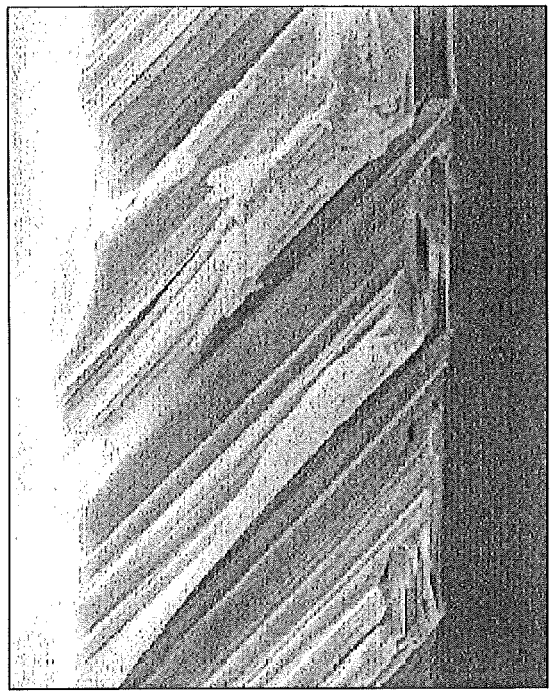
Figure 6D:
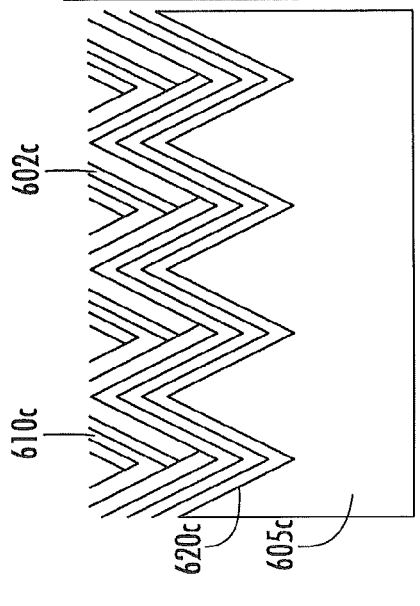
Figure 6D:
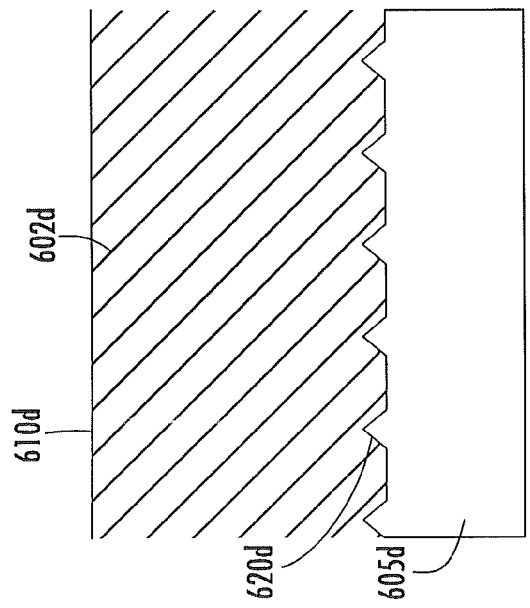

In contrast, in the examples of FIGS. 6C and 6D according to some embodiments of the present invention, the stripes in the substrates 605c, 605d are oriented parallel to the <010> direction, such that etching reveals (101) and (10$\bar{1}$) planes as well as (001) and (00$\bar{1}$) planes. As shown in the photographs of FIGS. 6C and 6D, this <010> stripe orientation results in the growth of a continuous $Bi_2Te_3$ film 602c, 602d having a substantially planar surface 610c, 610d and a thickness of about 15 μm, which can be grown over approximately the same duration as used to grow the $Bi_2Te_3$ films of FIGS. 6A and 6B. Thus, by defining inclined growth surfaces 620c, 620d in the substrate 605c, 605d having the orientation of those shown in FIG. 6C-6D (or similar orientations), growth of substantially planar and coalesced thermoelectric films (having crystallographic orientations shown by the hatched lines in FIGS. 6C and 6D) that are suitable for device processing can be achieved. It should be noted that the protrusions on the surface of the grown film 602c, 602d opposite to the substantially planar surface 610c, 610d (which defines shapes inversely corresponding to the inclined growth surfaces 620c, 620d on which the film 602c, 602d is grown) may be small enough to also be considered substantially planar, or can be removed in subsequent processing.

Accordingly, FIGS. 6A-6D illustrate that, while the crystallographic orientations of the thermoelectric films described herein may define planes that are inclined or tilted at an angle that is equal to or greater than that of the facets or sidewall surfaces on which the films are grown, not all facet orientations will result in film coalescence in accordance with embodiments of the present invention.

Figure 7A:
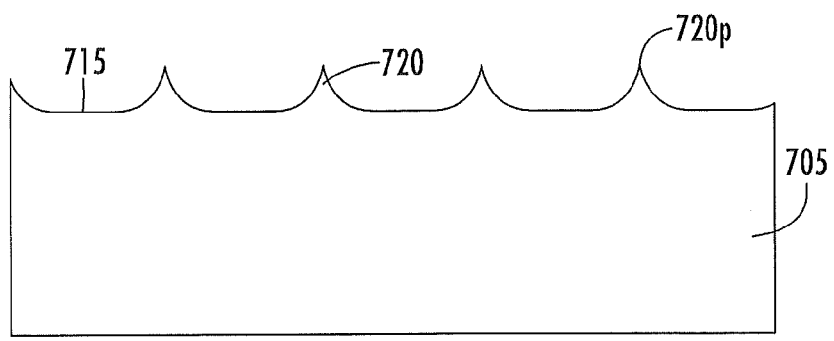
FIGS. 7A-7C illustrate methods of fabricating thermoelectric films in accordance with further embodiments of the present invention.
Figure 7B:
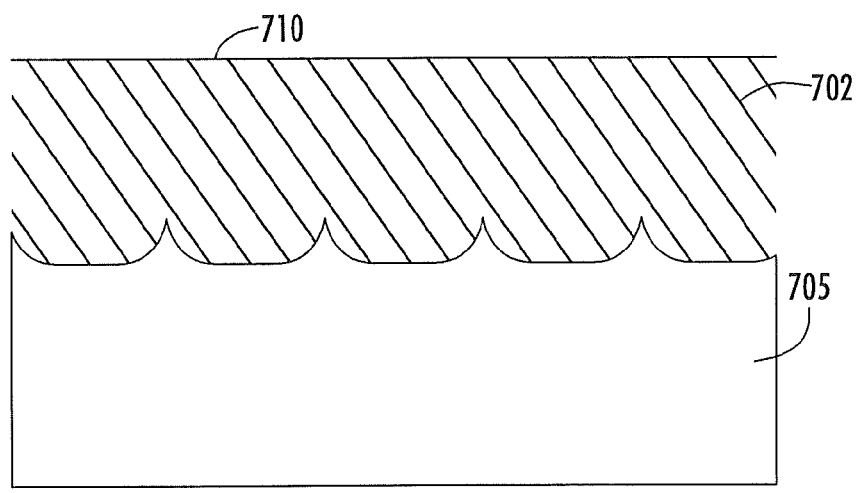
Figure 7C:
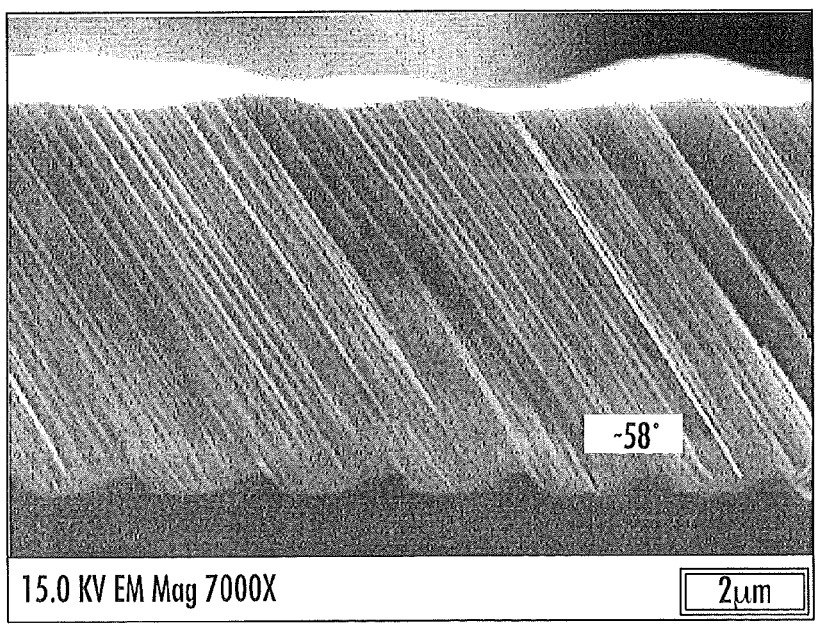

FIGS. 7A-7C illustrate methods of fabricating thermoelectric films in accordance with further embodiments of the present invention. Referring now to FIG. 7A, a (100) surface 715 of a substrate 705 is patterned with a mask (photoresist, $SiO_2$, $Si_3N_4$, etc.) to define inclined features 720 in the substrate surface. The substrates or wafers described herein may refer to silicon (Si), gallium arsenide (GaAs), barium fluoride (BaF), silicon carbide (SiC), gallium nitride (GaN), aluminum nitride (AlN), sapphire, and/or glass. Referenced crystal planes generally refer to cubic system indices, but other comparable planes are intended for hexagonal or other crystal structures. In particular, the portions of the substrate surface 715 exposed by the mask are wet etched with an isotropic component to define trenches having highly inclined sidewall surfaces 720 that protrude from the substrate surface 715 by about 0.1 to 2 μm or more (about 5-50% of the pitch between trench sidewalls). It will be understood that, as used herein, pitch may also refer to an average spacing between protrusions 720p, as in the case where the protrusions are not elongated, periodic stripes, but nevertheless increase the tilt of the TE material. The trenches may be aligned with or otherwise extend substantially parallel to the [010] direction to define protruding ridges 720p therebetween. Also, sidewalls 720 of the trenches/ridges 720p may define planes that are inclined by up to about 90 degrees relative to the (100) plane defined by the surface 715 of the growth substrate 705.

As shown in FIG. 7B, a V-VI thermoelectric thin film 702 is epitaxially grown on the patterned growth surface 715. In particular, separate portions of the film 702 grown on the sidewalls 720 and the bottom (which may be defined by portions of surface 715) of the trenches may coalesce to define a continuous thermoelectric thin film 702 having a substantially planar surface 710. As noted above, the lattice alignment of the patterned growth surface 715 may impact the crystallographic orientation (illustrated by the hatched lines in FIG. 7B) of the grown thermoelectric film 702. More particularly, the etched trench shape and trench direction are specifically selected to increase the inclination of the C-planes in the grown film 702 relative thereto, to enable a C-tilt of about 45 degrees or more relative to the growth surface 715 (or about 45 degrees or less relative to a direction along the thickness of the film 702). For example, FIG. 7C illustrates a SEM cross-sectional image of a thermoelectric film having a C-tilt of about 58 degrees that was formed in accordance with embodiments described herein.

Figure 8:
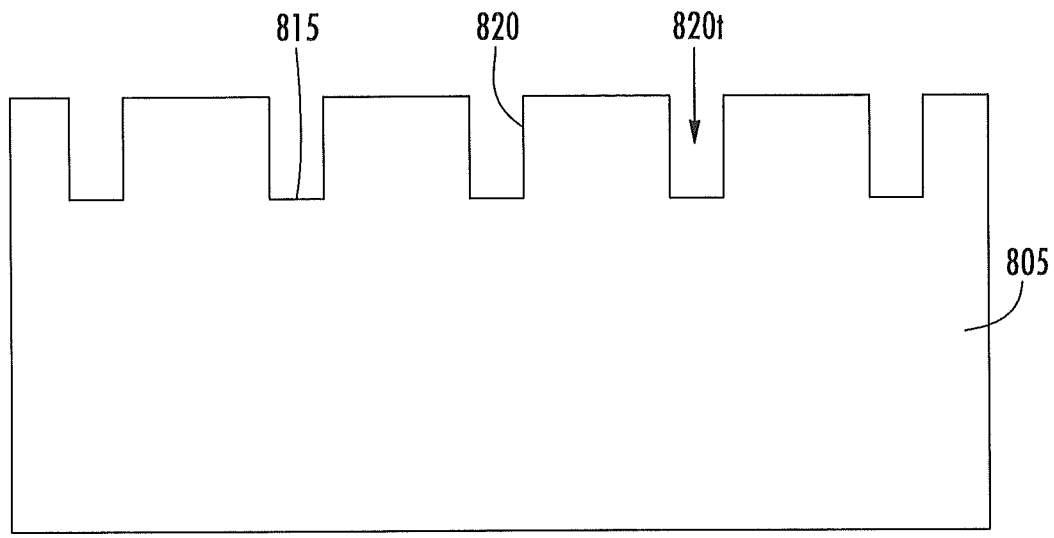
FIGS. 8, 9, and 10A-10C illustrate methods of forming inclined growth surfaces and depositing thermoelectric films in accordance with yet further embodiments of the present invention.
Figure 9:
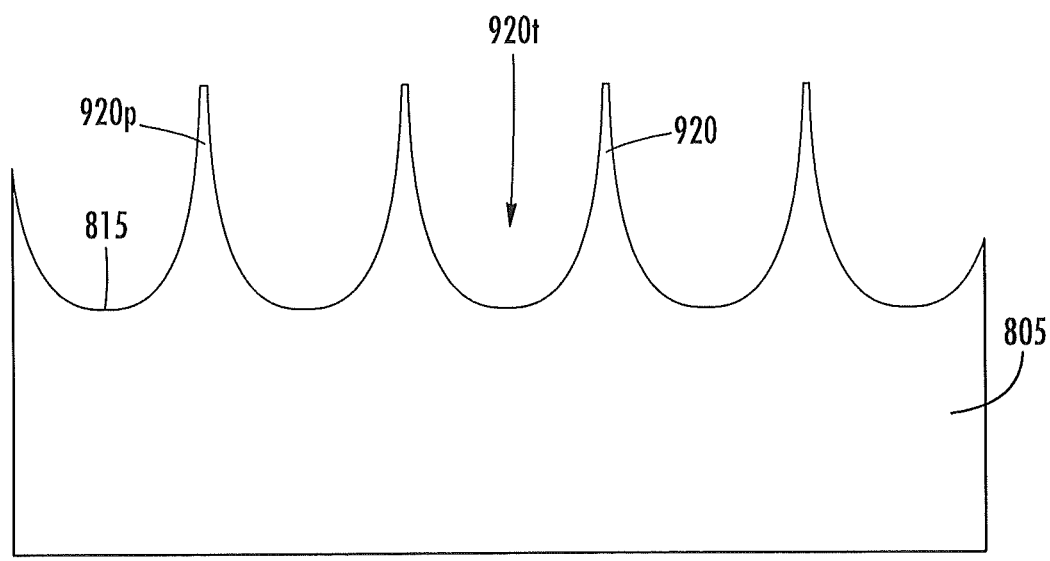

FIGS. 8-10C illustrate methods of fabricating thermoelectric films in accordance with yet further embodiments of the present invention. Referring now to FIG. 8, a (100) growth surface 810 of a substrate 805 is patterned with a mask (photoresist, $SiO_2$, $Si_3N_4$, etc.) to define inclined features 820 in the substrate surface 810. In particular, the portions of the growth surface 810 exposed by the mask are dry etched with a physical component to create high aspect ratio trenches 820t (e.g., having a ratio of width to height of about 1:1 to about 10:1 or more) in the growth surface 815, as shown in FIG. 8. These high-aspect ratio trenches 820t are wet etched with an isotropic component to provide curved or cycloid-shaped sidewalls that include highly inclined sidewall surfaces or facets 920 as shown in FIG. 9. The sidewall surfaces 920 may include or comprise near vertical planes, for example, the (001) and (00$\bar{1}$) planes. In particular, FIG. 9 illustrates {001} or {00$\bar{1}$} facets/surfaces 920 that are inclined by up to about 90 degrees relative to the (100) growth surface 810 of the substrate 805. The sidewall surfaces 920 may define peaks 920p that protrude from the surface 815 of the substrate 805 by about 3 μm or more. A pitch between adjacent peaks 920p may be preferably less than 5 μm for ease of coalescence or more preferably less than about 2 μm. In some embodiments, to create high-tilt conditions with about 1 μm pitch, peaks that protrude by more than about 0.5 μm may be used; with about 2 μm pitch, peaks of greater than about 1 μm may be used.

Figure 10A:
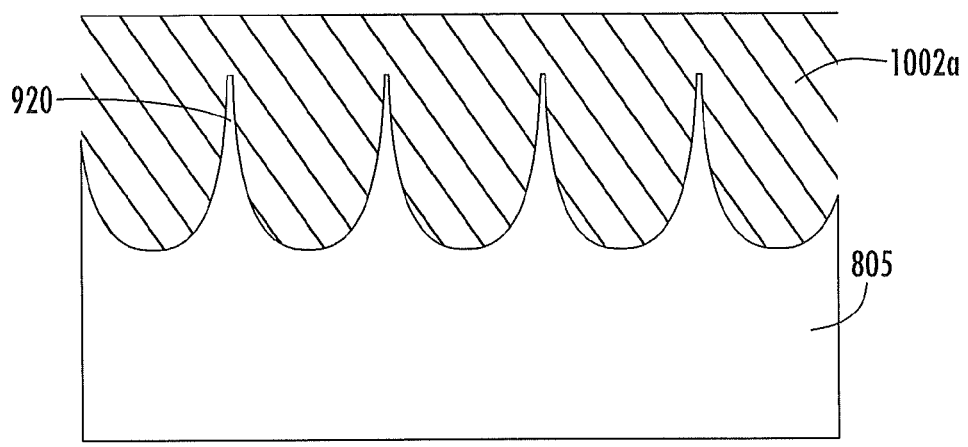
Figure 10B:
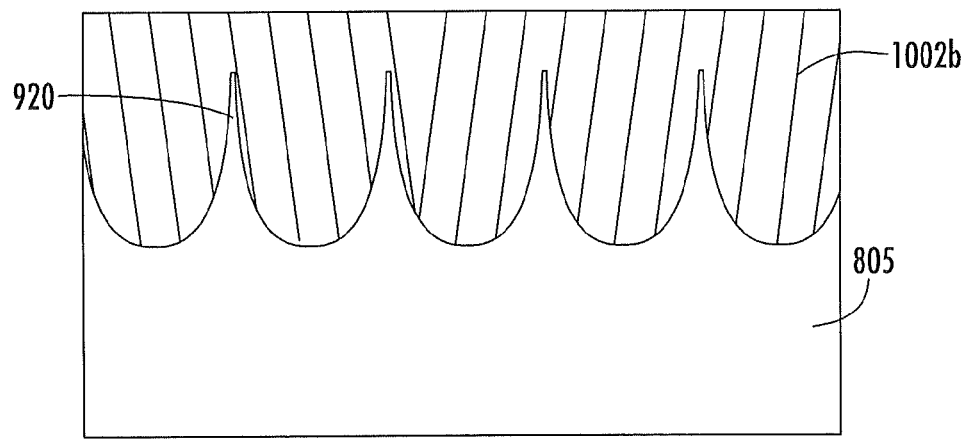
Figure 10C:
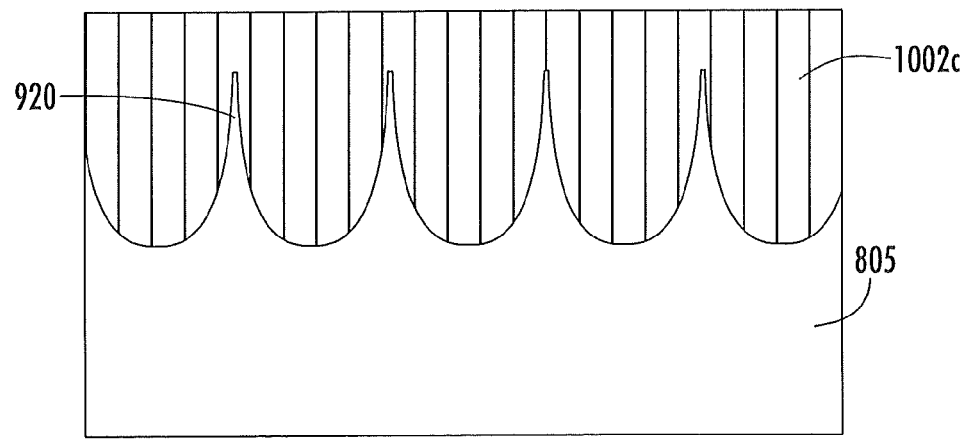

FIGS. 10A-10C illustrate epitaxial growth and coalescence of the V-VI film on the patterned growth surface 815 of FIG. 9. As the lattice alignment of the patterned growth surface 815 affects the crystallographic orientation (shown by the hatched lines in FIGS. 10A-10C) of the grown thermoelectric film, the etched trench shape and trench direction can be specifically selected to increase the inclination of the C-planes in the grown film. In particular, when formed using a combination of dry and wet etching as described with reference to FIGS. 8 and 9, the trenches 920t in the growth surface 815 may enable growth of a V-VI film having a C-tilt of about 45 degrees or more (1002a; FIG. 10A), about 70 degrees or more (1002b; FIG. 10B), or up to about 90 degrees (1002c; FIG. 10C). Also, as shown in FIG. 10B, several different inclinations may be present or coexist in a highly oriented crystal 1002b that has high average tilt of the C-planes. In other words, the film 1002b shown in FIG. 10B includes a plurality of non-uniform crystallographic orientations, but at least half of the plurality of non-uniform crystallographic orientations are tilted at respective angles of about 70 degrees or more.

Figure 11:
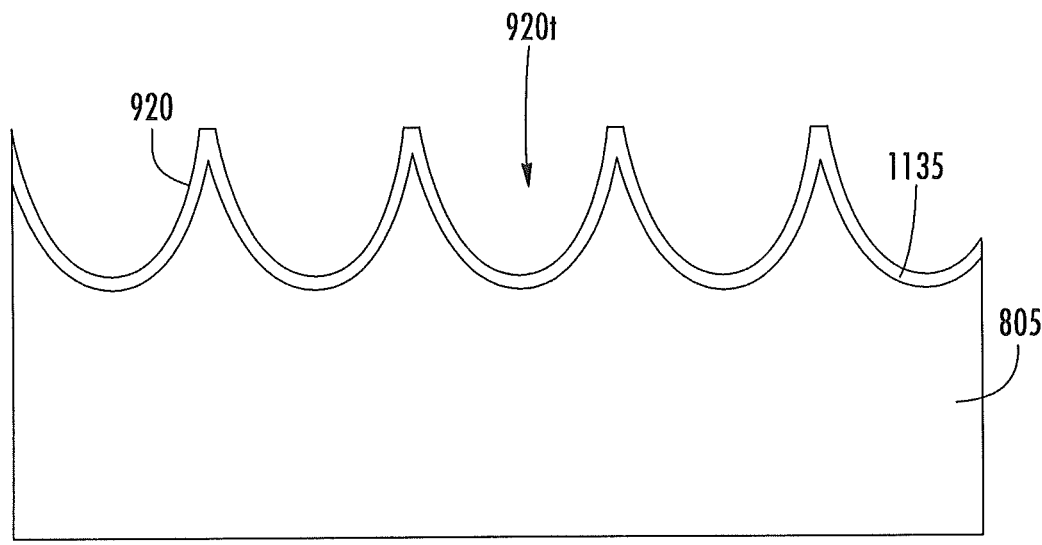
FIGS. 11, 12, and 13A-13B illustrate methods of forming inclined growth surfaces and depositing thermoelectric films in accordance with still further embodiments of the present invention.
Figure 12:
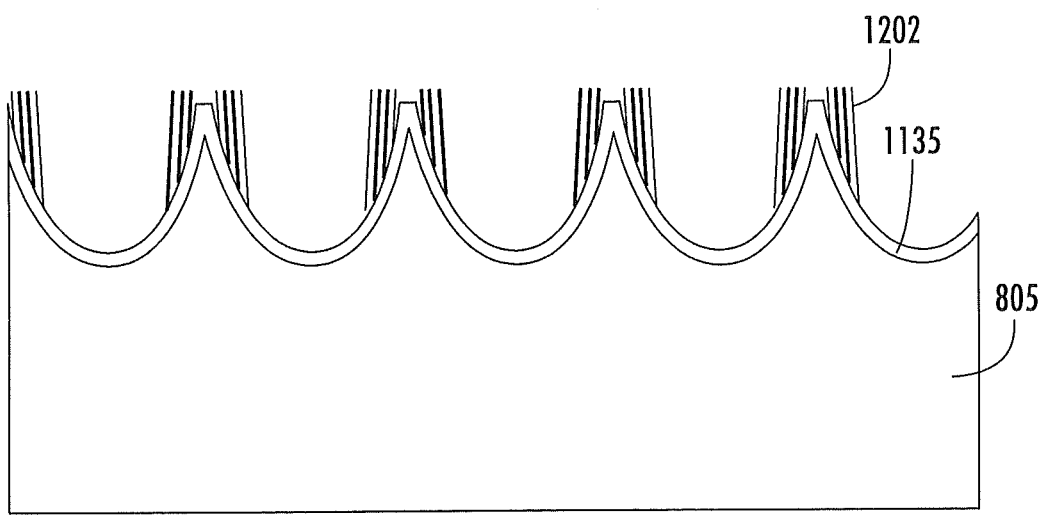
Figure 13A:
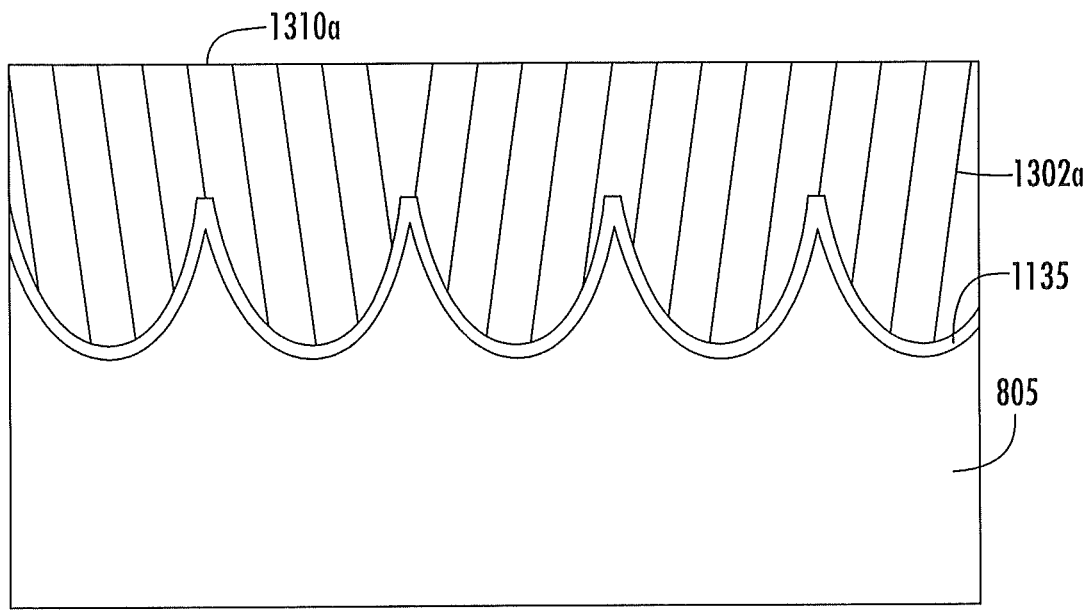
Figure 13B:
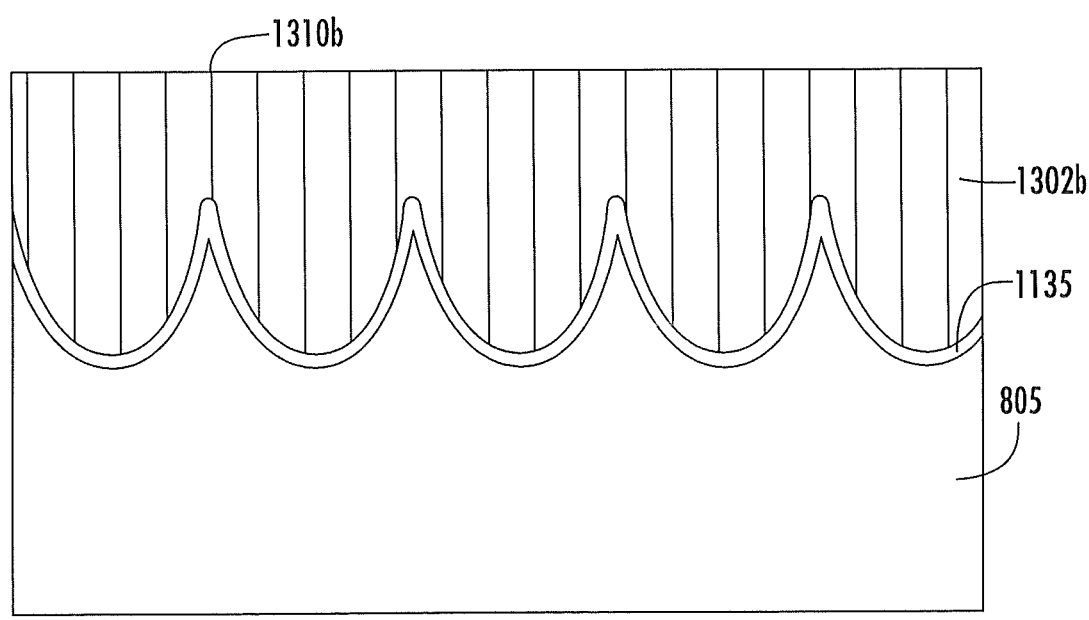

FIGS. 11-13B illustrate methods of fabricating thermoelectric films in accordance with still further embodiments of the present invention. Referring now to FIG. 11, after forming trenches 920t including {001}, {00$\bar{1}$}, and (100) surfaces in the (100) growth surface 815 of the substrate 805 as shown in FIG. 9, a relatively thin intermediate material layer 1135 (for example, about 20-500 Å) is deposited (for example, by sputtering or evaporation) along the substrate 805 and the surfaces 920 of the high aspect ratio trenches 920t therein. The intermediate material layer 1135 is configured to alter one or more surface properties of the growth substrate 805 on which it is deposited, and may be referred to herein as a surface changing layer. The intermediate material layer 1135 may be platinum (Pt), nickel (Ni), gold (Au), aluminum (Al), other metals (such as transition metals or alloys thereof), metal oxides (such as silicon dioxide ($SiO_2$), indium tin oxide (ITO), etc.), and/or alternate surface changing species. The intermediate material layer 1135 is relatively thin (for example, less than about 500 Å), but is thick enough so as to substantially affect the characteristics of the surfaces on which it is deposited. In some embodiments, the intermediate layer 1135 may be patterned and/or include portions having different thicknesses, which may itself induce inclined growth surfaces. As such, as illustrated in FIGS. 12-13B, the presence of the intermediate material layer 1135 may provide unexpected benefits, in that it may enable growth of thermoelectric films with crystallographic orientations that are tilted at higher angles than on surfaces without the intermediate material layer 1135.

FIG. 12 illustrates nucleation and initial growth of an epitaxial V-VI thermoelectric thin film 1202 on the sidewalls/facets 920 of the patterned GaAs growth surface 815 of FIG. 11 including an intermediate layer 1135 as described above thereon. As shown in FIG. 12, the crystallographic tilt of the thermoelectric film 1202 may match or exceed the angle inclination of the sidewalls/facets 920 protruding from the substrate 805. In particular, the incline of the C planes in the thermoelectric film 1202 may be further increased due to alignment of substrate-to-epi layer crystal planes. The rate of epitaxial growth on the upper portions of the sidewall surfaces/facets 920 having higher angles of inclination (relative to the (100) surface) is also significantly greater than that on the lower portions of the sidewall surfaces/facets 920 (e.g., at the base of each trench 920t), thereby encouraging the growth (and eventual coalescence) of higher-tilt crystallographic orientations and effectively suppressing growth of lower-tilt crystallographic orientations in the thermoelectric film 1202.

FIGS. 13A and 13B illustrate continued growth and coalescence, resulting in thermoelectric thin films 1302a, 1302b having substantially planar surfaces 1310a, 1310b. As the lattice alignment of the patterned growth surface 815 affects the crystallographic orientation (illustrated by the hatched lines in FIGS. 13A and 13B) of the epitaxial thermoelectric film 1302a, 1302b, the etched trench shape and trench direction can be specifically selected to provide a grown film 1302a, 1302b having C-planes with a tilt of about 45 degrees or more. The intermediate layer 1135 assists in the growth of high-tilt V-VI thermoelectric films on the substrate 805. In some embodiments, thermoelectric films having crystallographic tilts of greater than about 75 degrees (1302a; FIG. 13A) or up to about 90 degrees (1302b; FIG. 13B) can be achieved. Also, as shown in FIG. 13A, several different or non-uniform inclinations may coexist to provide a highly oriented crystal 1302a that has high average or majority of the C-planes with a tilt of about 45 degrees or more. In contrast, as shown in FIG. 13B, the inclinations of the C-planes may be substantially uniform throughout the film 1302b.

Figure 14A:
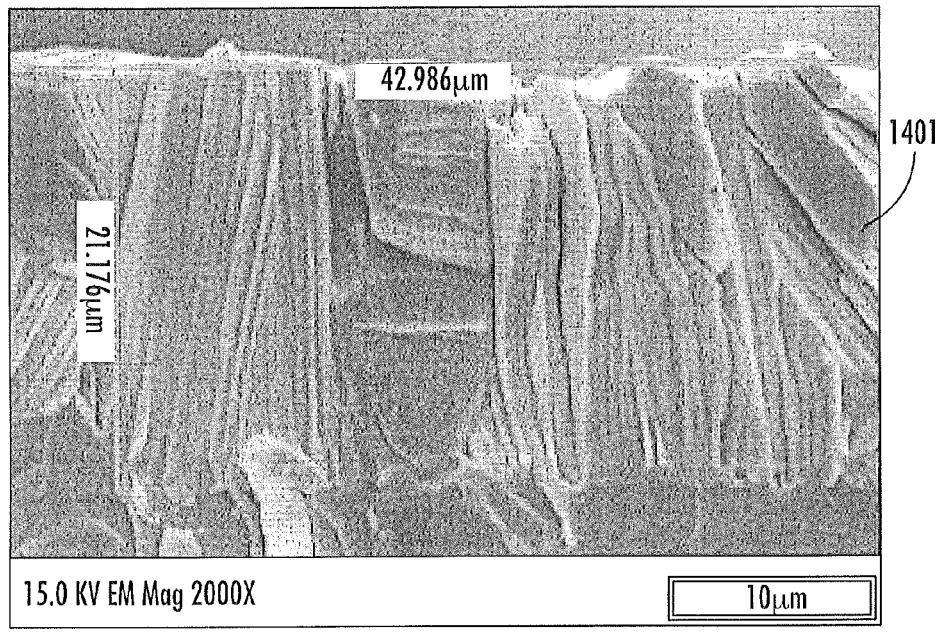
FIGS. 14A and 14B are scanning electron microscope (SEM) cross sectional images illustrating two examples of thermoelectric films with high crystallographic tilt in accordance with some embodiments of the present invention.
Figure 14B:
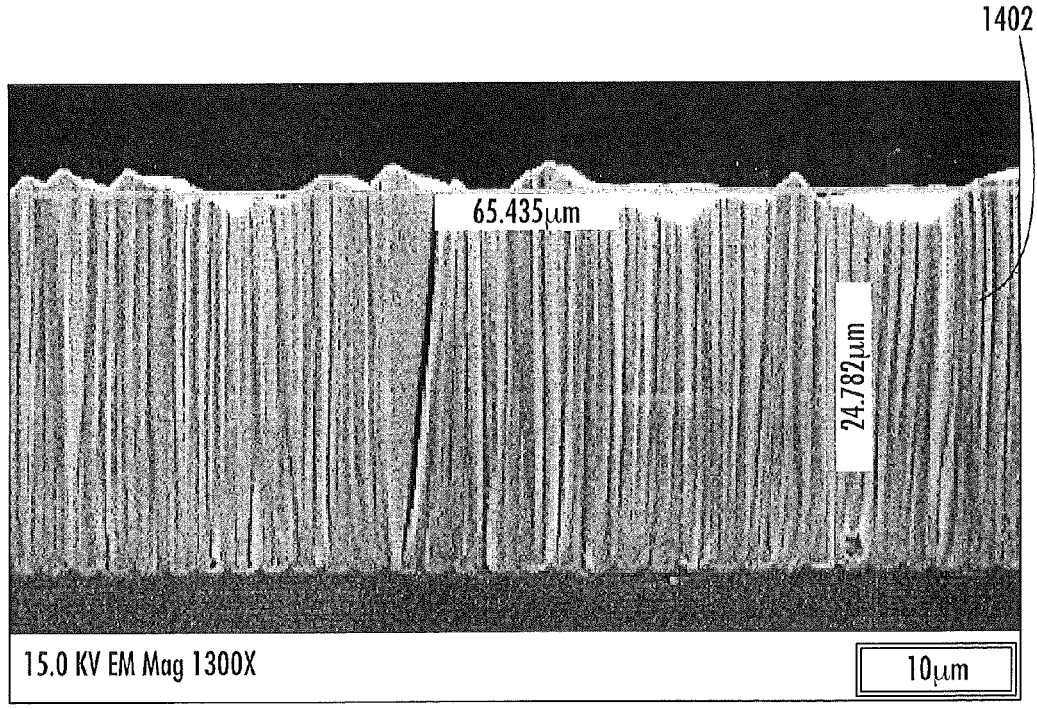

FIGS. 14A and 14B are SEM cross sectional images illustrating two examples of epitaxial thermoelectric films with high tilt (that is, orientation of the low resistivity C plane in the near vertical direction). In particular, the thermoelectric film 1401 of FIG. 14A includes a plurality of non-uniform or inhomogeneous crystallographic tilts, while the thermoelectric film 1402 of FIG. 14B includes more substantially uniform or homogeneous crystallographic tilts. The grown films 1401, 1402 have a predominant tilt for (e.g., more than about half of the tilts present in the grown films 1401 and 1402) of about 45 degrees or more.

Figure 14C:
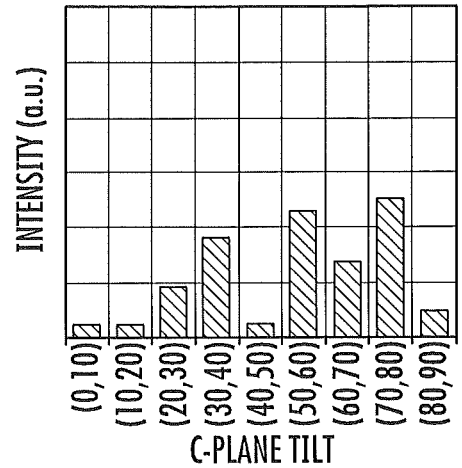
FIGS. 14C-14H are graphs illustrating further possible C-plane tilts and ranges in accordance with some embodiments of the present invention.
Figure 14D:
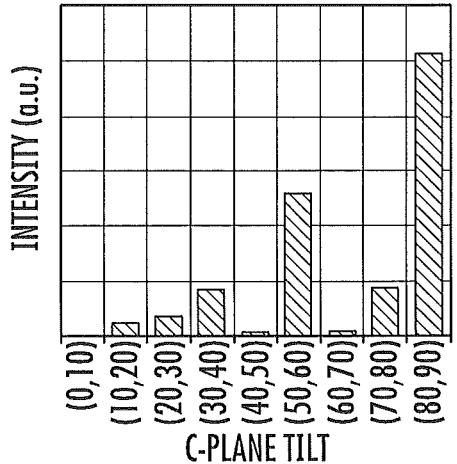
Figure 14E:
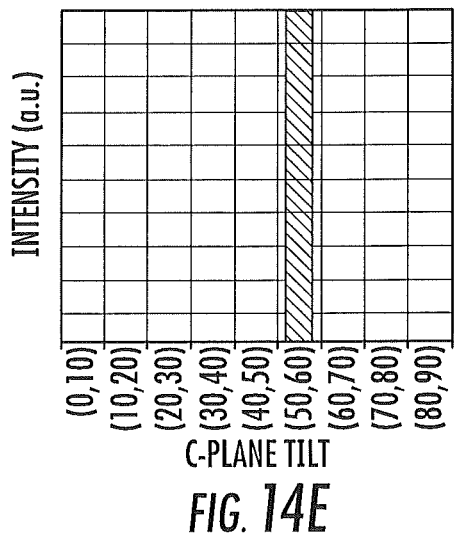
Figure 14F:
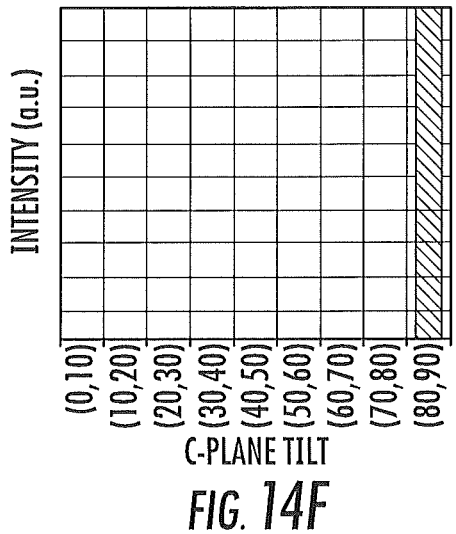
Figure 14G:
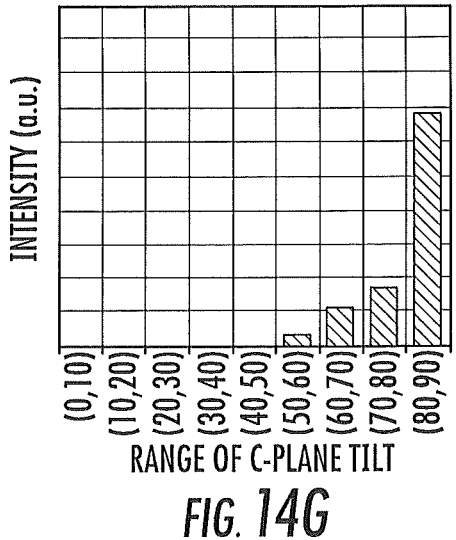
Figure 14H:
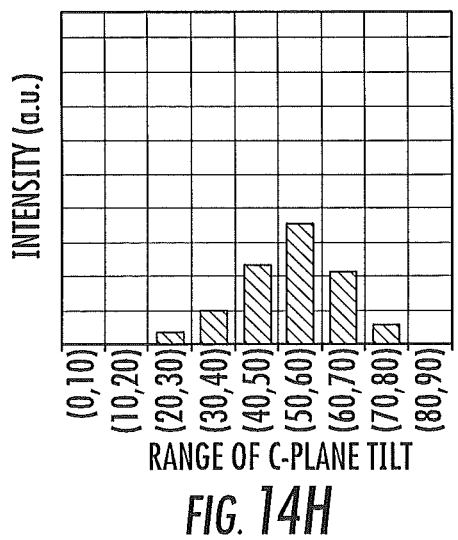

FIGS. 14C-14H are graphs illustrating possible C-plane tilts and ranges in accordance with some embodiments of the present invention. As shown in FIGS. 14C and 14D, the predominant tilt of the (0015) plane (a C-plane that includes the direction of lowest resistivity) in some thermoelectric films according to embodiments of the invention described herein can be about 45 degrees or more (FIG. 14C), or even greater than about 65 degrees (FIG. 14D) in some embodiments. FIGS. 14E-14H are graphs illustrating more homogeneous C-plane tilts (FIGS. 14E and 14F) and/or ranges of C-plane tilts (FIGS. 14G and 14H) that may be achieved in accordance with some embodiments of the present invention.

FIGS. 15-21 illustrate methods of fabricating thermoelectric modules including high crystallographic tilt thermoelectric films in accordance with some embodiments of the present invention. The thermoelectric films may be grown in accordance with any of the embodiments described above. The patterned growth substrate 1505 is sacrificial, and thus the thermoelectric film 1502 can be removed from the growth substrate during incorporation into the thermoelectric module. While illustrated in FIGS. 15-17 as being n-type, it will be understood that the grown thermoelectric film 1502 may have n-type or p-type conductivity. Also, while illustrated in FIGS. 18-21 with reference to TE modules where both the n-type and p-type elements 1502n, 1502p have increased crystallographic tilt, it will be understood that embodiments of the present invention are not so limited, and that either or both of the n-type/p-type elements 1502n/1502p in the module can have the increased tilt.

Figure 15:
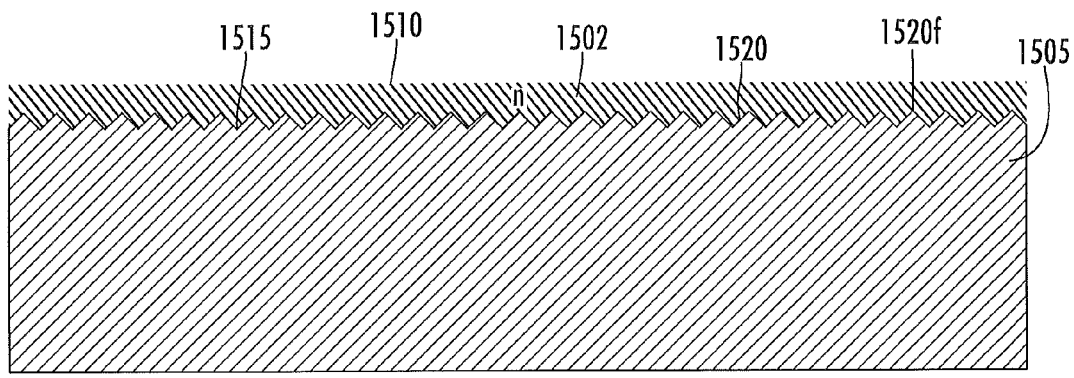
FIGS. 15-21 illustrate methods of fabricating thermoelectric modules including high crystallographic tilt thermoelectric films in accordance with some embodiments of the present invention.

Referring now to FIG. 15, an n-type thermoelectric film 1502 is formed on a patterned substrate 1505 including inclined growth surfaces 1520 that define peaked features 1520f protruding from the substrate 1505. The peaked features 1520f include sidewall surfaces 1520 that are tilted at an angle of about 45 degrees or more relative to a crystallographic or physical orientation of the substrate surface 1515. The tilt of the sidewall surfaces 1520 of the peaked features 1520f relative to the substrate surface 1515 (and/or the presence of a intermediate layer) is sufficient to encourage coalescence of portions of the thermoelectric film 1502 grown on adjacent sidewall surfaces, resulting in a continuous thermoelectric film structure 1502 with a crystallographic tilt of about 45 degrees or more of the C-plane with respect to the macroscopic substrate surface.

The n-type (or p-type) thermoelectric film 1502 can be formed into n-type (or p-type) thin-film elements 1502n, 1502p suitable for the manufacture of thermoelectric devices that take advantage of the more favorable tilt direction/crystal orientation to provide improved thermoelectric performance. More particularly, when complete, the n-type and/or p-type elements 1502n and/or 1502p may have improved alignment of the C-planes with the heat/electrical flow direction compared with standard thermoelectric thin films.

Figure 16:
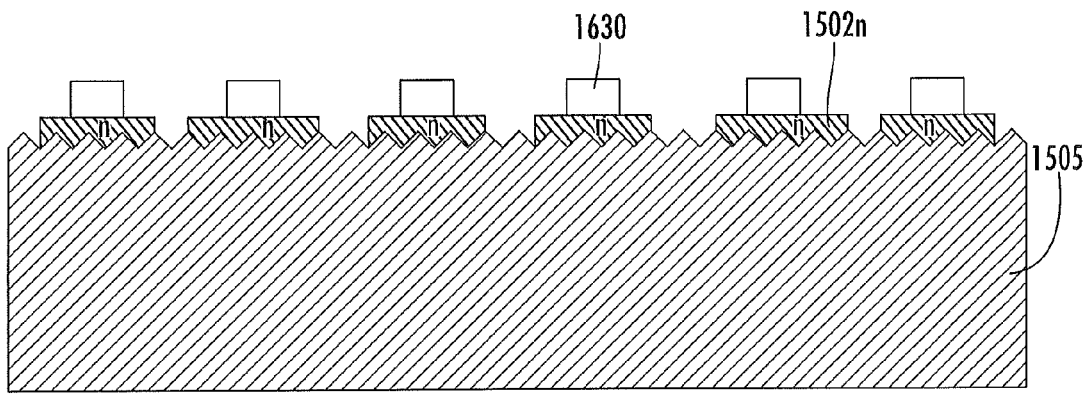
Figure 17:
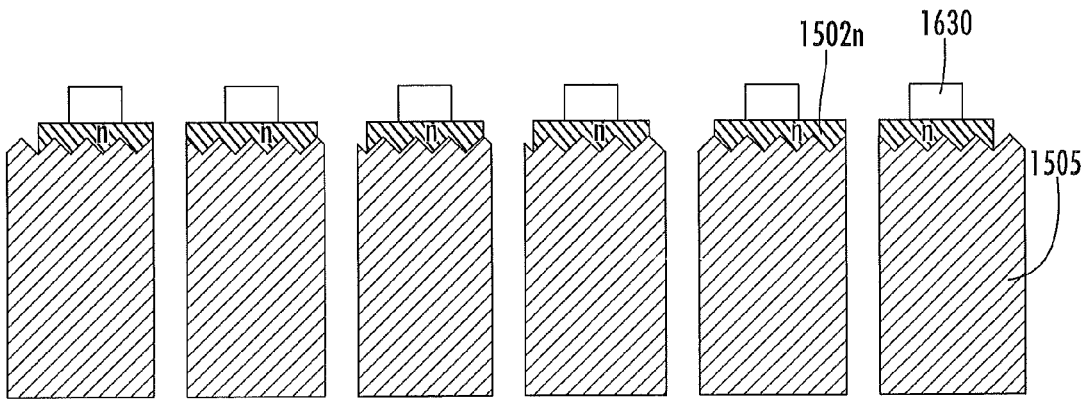

In particular, as shown in FIG. 16, a metallization process is performed on the substantially planar surface 1510 of the thermoelectric film 1502 (for example, via photolithography and electroplating and/or evaporation) to form contacts 1630 thereon. The thermoelectric film 1502 is etched (dry or wet) or otherwise singulated into separate thermoelectric elements 1502n on the substrate. FIG. 17 illustrates further singulation into individual elements by dicing through the sacrificial substrate 1505. This allows individual or groups of n-type (or p-type) elements 1502n, 1502p to be handled and placed into modules, depending on how the elements are electrically routed on the substrate.

Figure 18:
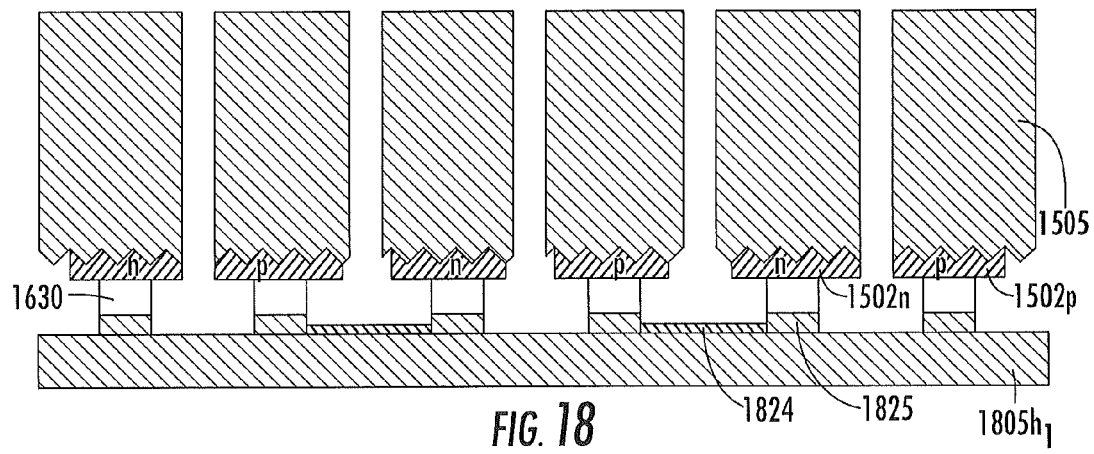

As shown in FIG. 18, n-type and p-type thin film thermoelectric elements 1502n, 1502p (which may be formed in accordance with FIGS. 15-17) are alternatingly placed onto a first header 1805$h_1$, which includes contacts 1825/metallization 1824 for electrically connecting the thermoelectric elements 1502n, 1502p in series. The first header 1805$h_1$ may be a metalized ceramic header in some embodiments. Solder bumps and reflow are used to form the electrical and thermal connection between the singulated thermoelectric elements 1502n, 1502p and the first header 1805$h_1$.

Figure 19:
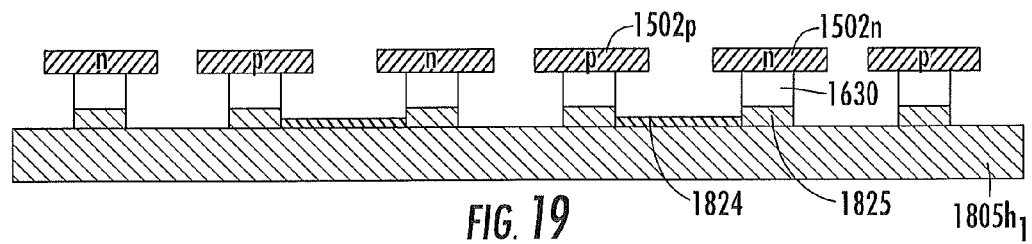

As shown in FIG. 19, the sacrificial substrate is removed to expose or otherwise allow access to the backside of the thermoelectric elements 1502n, 1502p. In some embodiments, portions of the backsides of the thermoelectric elements 1502n, 1502p may be removed or polished or otherwise planarized to provide the backsides of the thermoelectric elements with substantially planar surfaces; however, such removal may be optional, and, in some embodiments, the backside of the epitaxial film elements 1502n, 1502p may include at least some patterning or protruding features, having angles of incline that inversely correspond to those of the patterned substrate on which the thermoelectric elements were formed.

Figure 20:
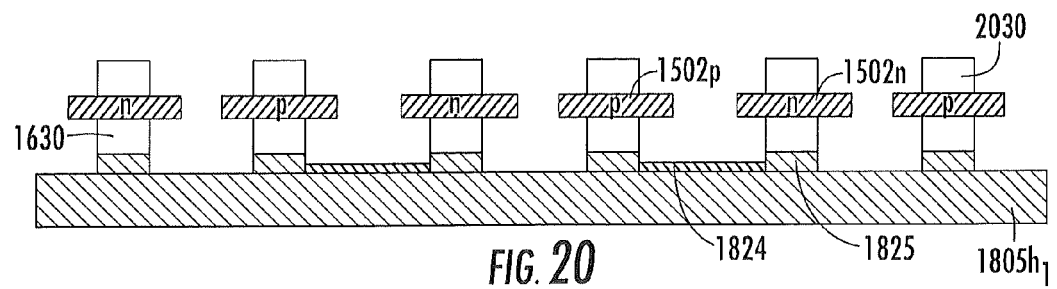
Figure 21:
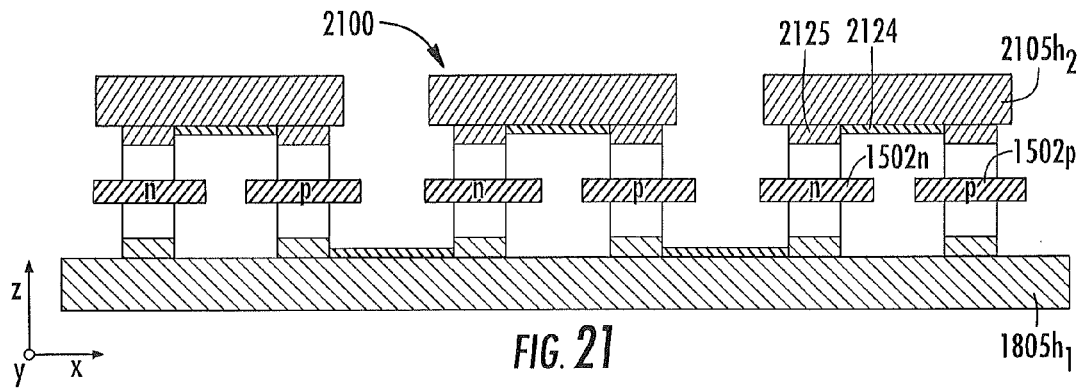

FIG. 20 illustrates metallization on the backside of the thermoelectric elements 1502n, 1502p. In particular, as shown in FIG. 20, backside solder bumps 2030 may be formed using photolithography and electroplating, and/or other metallization methods, on the backside surfaces of the thermoelectric elements 1502n, 1502p. As shown in FIG. 21, the second headers 2105$h_2$, which include contacts 2125/metallization 2124 for electrically connecting the thermoelectric elements 1502n, 1502p in series, are placed onto the thermoelectric elements 1502n, 1502p populated on the first header 1805$h_1$. The second headers 2105$h_2$ may be metalized ceramic headers in some embodiments. Solder bumps and reflow may be used to form the electrical and thermal connections between the thermoelectric elements 1502n, 1502p and the second headers 2105$h_2$.

Accordingly, using fabrication processes described herein, n-type and p-type elements may be placed or packaged between metalized ceramic headers to form a thermoelectric module 2100 including thermoelectric elements 1502n, 1502p electrically connected in series and thermally connected in parallel, with improved thermoelectric performance due to the closer alignment of the C-plane of the thermoelectric elements 1502n, 1502p with the direction of heat and current flow between the headers 1805$h_1$, 2105$h_2$ of the thermoelectric module 2100. In particular, the increased crystallographic tilt of the C-plane provides a reduction in electrical resistivity in the direction of current flow between the first and second headers 1805$h_1$ and 2105$h_2$. In some embodiments, the n-type and p-type elements 1502n, 1502p may have a substantially similar resistance.

Reduction in electrical resistance of thermoelectric modules described herein may be measured using epitaxial thermoelectric films of one particular conductivity or carrier type (e.g., n-type or p-type). The resistivity of modules built with one conductivity type along a vertical or z-direction (that is, in a direction along a thickness thereof or perpendicular to the headers when mounted in a thermoelectric module) was compared with the resistivity (measured by Hall effect and accounting for geometrical factors) of the as-grown epitaxial films along the horizontal or xy-direction. The ratio of resistivity in the xy-direction to the resistivity in the z-direction can be used as a metric to measure the amount of favorable tilt (e.g. crystallographic tilt that improves thermoelectric performance) is present in the epitaxially grown film.

Figure 22:
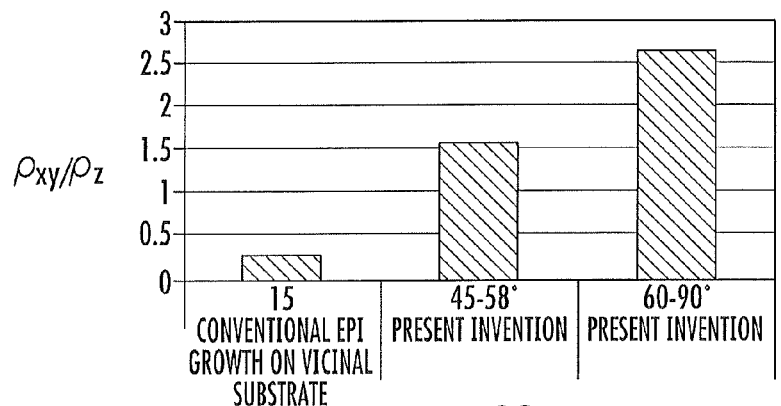
FIG. 22 is a graphical comparison of the ratio of the resistivity in the direction substantially parallel to the planar surface divided by the resistance in the direction substantially parallel to the thickness of the thin film material for some embodiments of the present invention compared with prior art.

Table 1 (below) and the bar graph of FIG. 22 show that a 5-fold and 9-fold increase in this ratio may be achieved using embodiments of the present invention. As shown in Table 1, when the ratio of the resistivity in the xy-direction ($\rho_{xy}$) to the ratio of the resistivity in the z-direction ($\rho_z$) of the thermoelectric film is greater than 1, this indicates that the effective tilt of the c-axis is greater than 45 degrees:

TABLE 1

| Approach | Epi Tilt | $\rho_{xy}/\rho_z$ |
|---|---|---|
| Conventional epi growth on vicinal substrate | 15 | 0.3 |
| Present Invention | 45-58° | 1.6 |
| Present Invention | 60-90° | 2.7 |

Figure 23:
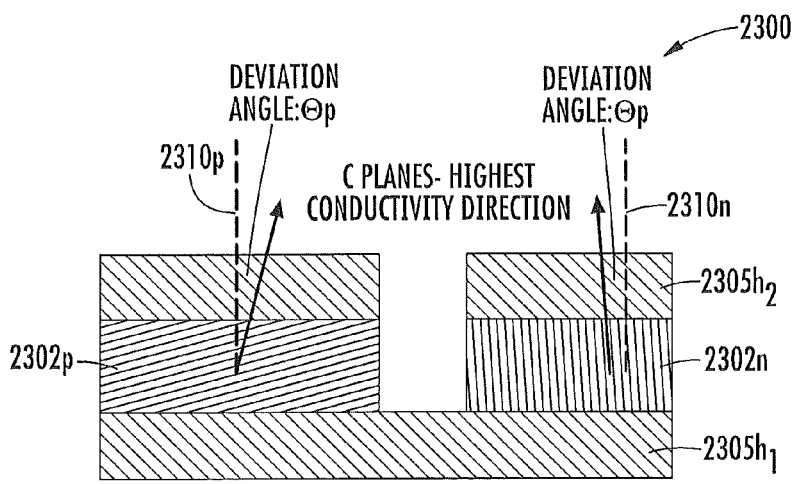
FIG. 23 is a cross sectional view of thermoelectric modules include both n-type and p-type thin film elements in accordance with embodiments of the present invention.

It will be understood that thin film thermoelectric modules in accordance with embodiments of the present invention can be fabricated using the methods described herein to include both n-type and p-type elements, resulting in the structure 2300 of FIG. 23. In particular, as shown in FIG. 23, N-type elements 2302n and P-type elements 2302p of a thermoelectric module or device 2300 have improved alignment of the C-planes with the heat/electrical flow directions 2310n, 2310p, and may have deviation angles Θn and/or Θp of less than 45 degrees, and even less than 25 degrees, relative to the direction of heat/electrical flow 2310n and/or 2310p in the device. The n-type and p-type elements 2302n and 2302p are placed between metalized ceramic headers 2305$h_1$, 2305$h_2$ such that the n-type and p-type elements 2302n and 2302p are electrically connected in series, and thermally connected in parallel between the headers 2305$h_1$, 2305$h_2$.

Modules were made with two different pairings of tilted thermoelectric thin films: group (1), which includes n-type and p-type elements with a C-plane tilt of less than about 20°; and group (2), which includes p-type elements with C-plane tilt of about 25-35°, and n-type elements with effective C-plane tilt of greater than about 60°. The resistance of the n-elements were increased to match the resistance/optimize current ($I_{max}$) of the p-elements by changing the cross-sectional area of the elements and/or the contact area. The $\Delta T_{max}$ (at hot side temperature of 25 degrees Celsius) of the modules from group 2 were about 55° C. or more (and in some cases greater than 60° C.) and 40% greater than the $\Delta T_{max}$ measured from group 1. Accordingly, in some embodiments of the present invention, improved thermoelectric performance can be provided when both p-type and n-type elements have increased crystallographic tilt as described herein, and may be further improved when both p-type and n-type elements are matched in resistance and/or $I_{max}$.

Further variations (as described below) may be used with or otherwise applied to one or more of the embodiments described herein.

In some embodiments, the starting/growth wafer may be patterned with a mask (photoresist, $SiO_2$, $Si_3N_4$, etc.) to expose openings in the wafer surface. Any masking/etching technique that enables etching to reveal inclined growth surfaces in the underlying substrate, including self-aligned methods, may be used.

In some embodiments, wet and/or dry etch processes may be used to etch trenches into the substrate. The trenches may include inclined growth surfaces or sidewalls that comprise or at least partially expose, for example, the {110}, {111}, {101}, {210}, {211}, and/or {001} crystal plane families. Other inclined planes favorable to epi growth and coalescence of thermoelectric layers may also be used.

In some embodiments, textured growth substrates having a plurality of inclined facets/growth surfaces may be used. The textured growth surfaces may be achieved via blanket anisotropic etching. For example, a porous mask to may be used to etch through small holes/openings therein, which may result in many inclined growth surfaces on the surface of the growth substrate.

In some embodiments, the inclined facets/growth surfaces may be ready for epitaxy as-etched, or can be further cleaned or prepared after etch or mask removal.

In some embodiments, wet etching with an anisotropic component may be used to reveal highly inclined growth surfaces that extend along the (101) and (10$\bar{1}$) planes. These crystal planes may be favorable for the growth of thermoelectric films having tilted C-planes as described herein.

In some embodiments, wet etching with an anisotropic or isotropic component may be used to define trenches in the growth substrate that are oriented parallel to the [010] direction.

In some embodiments, wet etching with an isotropic component may be used to define highly inclined growth surfaces extending along the (001) and (00$\bar{1}$) planes or other near vertical planes. Such crystal planes may be favorable for the growth of thermoelectric films having tilted C planes as described herein.

In some embodiments, wet etching with an isotropic component may be used to define trenches oriented substantially parallel to the [010] direction to partially reveal inclined growth surfaces extending along, comprising, and/or at least partially exposing the (001) and (00$\bar{1}$) planes.

In some embodiments, wet etching with an isotropic component may be used to define trenches oriented parallel to the [010] direction to reveal inclined growth surfaces extending along, comprising, and/or at least partially exposing the {210} and/or {211} crystal plane families.

In some embodiments, dry etching may be used to define high aspect ratio trenches in the substrate, which may extend parallel to the [010] direction in some embodiments.

More generally, embodiments of the present invention include methods of trench and/or facet formation to provide high tilt, epi ready inclined growth surfaces through any combination of dry etching and/or wet etching. The respective thermoelectric material layers grown on such inclined growth surfaces coalesce to define a continuous thermoelectric film. Embodiments of the present invention may thus be used to fabricate entire wafers that are coalesced and planar over several square centimeters, which are suitable for semiconductor processing. In some embodiments, the thermoelectric film may be singulated to define individual thermoelectric elements that extend along a direction substantially parallel to opposing surfaces thereof by greater than about 50 micrometers, greater than about 100 micrometers, greater than about 200 micrometers, or greater than about 500 micrometers. As such, thermoelectric films in accordance with embodiments of the present invention described herein may be suitable for semiconductor processing as wafers or coupons, for example, in the manufacturing thermoelectric modules.

In some embodiments, a thin intermediate layer of a surface-changing material may be deposited on the inclined growth surfaces to change the surface chemistry and/or structure of the crystal planes to selectively enable higher tilt epitaxial growth and/or prevent low tilt growth. The intermediate material layer can be sputtered, evaporated, or otherwise deposited on the inclined growth surfaces formed in accordance with embodiments described herein. Possible surface-changing materials may include transition metals such as chromium (Cr), copper (Cu), gold (Au), iridium (Ir), iron (Fe), nickel (Ni), niobium (Nb), palladium (Pd), platinum (Pt), silver (Ag), tantalum (Ta), titanium (Ti), tungsten (W), and/or alloys thereof such as Au:Pd, Pt:Pd, or oxides such as silicon dioxide ($SiO_2$), indium tin oxide (ITO), etc. that define a layer having a thickness of less than about 500 Angstroms (Å). Also, as grain size of the sputtered particles may impact subsequent epi growth, Pt or alloys like Au:Pd, or Pt:Pd may be beneficial. The intermediate material layer can be deposited on surfaces and sidewalls of trenches that are formed by wet and/or dry etching techniques.

In some embodiments, epitaxial thermoelectric thin films may be grown on inclined facets, such that the incline of the C planes matches or exceeds that of the facets, for example, due to alignment of substrate-to-epi layer crystal planes.

In some embodiments, epitaxial thermoelectric thin films may be grown on inclined growth surfaces to produce thermoelectric films with C planes tilted greater than 45 degrees, greater than 65 degrees, or greater than 75 degrees relative to the substrate surface.

In some embodiments, epitaxial thermoelectric thin films may be grown on inclined growth surfaces that define sidewalls of trenches formed by wet and/or dry etching techniques.

In some embodiments, epitaxial thermoelectric thin films may be grown on inclined growth surfaces that define sidewalls of trenches formed by wet and/or dry etching techniques and coated with an intermediate material layer that is configured to alter one or more surface properties thereof.

Embodiments herein may be described with reference to crystallographic orientations of the growth substrate and/or surface thereof, crystallographic orientations of the inclined surfaces protruding from the surface of the growth substrate, and/or crystallographic orientations of the thermoelectric film formed on the inclined surfaces. It will be understood that crystallographic orientations and/or planes described herein with reference to tilt angles relative to a direction along a surface also include the complementary angles relative to a direction perpendicular to the surface, or vice versa.

In some embodiments, epitaxial thermoelectric thin films may be grown at a greater rate on inclined growth surfaces that extend along the (101) and/or (10$\bar{1}$) crystal planes, as compared with lower tilt surfaces or trench sidewalls.

In some embodiments, epitaxial thermoelectric thin films may be grown at a greater rate on inclined growth surfaces that extend along the (101), (10$\bar{1}$), or other crystal planes with tilt greater than 60 degrees, as compared with lower tilt surfaces or trench sidewalls.

In some embodiments, epitaxial thermoelectric thin films may be grown at a greater rate on {210} and/or {211} crystal plane families as compared with lower tilt surfaces or trench sidewalls.

In some embodiments, epitaxial thermoelectric layers may be grown and initial growth stages on separate inclined growth sites may coalesce to define continuous structures with high tilt of the C-planes with respect to the macroscopic substrate surface. In particular, embodiments of the present invention may provide coalescence of initial growth stages on separate inclined growth sites into a planar structure with about 45 degrees or more of tilt (or in some embodiments, more than about 54 degrees or 75 of tilt) of the C-planes with respect to the macroscopic substrate surface. Such planar thermoelectric films may be suitable for manufacturing thermoelectric modules including thermoelectric elements with high-tilt crystal orientations. Such a coalesced thermoelectric material layer can have multiple orientations (polycrystalline), but with a high degree of average tilt.

In some embodiments, distances between adjacent trenches may be formed as small as possible, such that sidewalls of adjacent trenches define peaks that protrude from the substrate, as planar surfaces between the sidewalls may encourage irregular growth. Trenches or inclined surfaces that protrude from the substrate by about 0.15 micrometers to about 2 micrometers may lead to earlier coalescence and prevention of growth on lower-angle surfaces.

In some embodiments, even slight tilt or asymmetry of one sidewall relative to another (i.e., 2 degrees) may be sufficient to encourage preferential or selective growth on one sidewall.

In some embodiments described herein, both p-type and n-type $Bi_2Te_3$ or other thermoelectric material layers can be initially grown; however, it will be understood that the conductivity type of the growth nucleation stage can be different than the majority of the growth to enhance nucleation conditions. The conductivity type can be changed by modifying growth conditions or constituents, which is a particular advantage of thin film growth.

Although described herein with reference to specific inclined growth surfaces along particular planes, such as {110}, {001}, {211}, {210}, {111}, embodiments of the present invention are not limited to such inclined surfaces and may include any inclined facets/surfaces that induce a crystallographic tilt of greater than about 45° in a thermoelectric film epitaxially grown thereon. Likewise, while striped trenches extending along the [010] direction may be used to achieve coalescence of the epitaxial TE film, other trench orientations and/or shapes may be used as well. Also, descriptions with reference to inclined surfaces protruding from a growth substrate may refer to any substrate suitable for the growth of thermoelectric thin films, including but not limited to, Si, GaAs, BaF, SiC, GaN, sapphire, glass and/or other growth substrates in accordance with embodiments of the present invention.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation.

That which is claimed:

1. A method of fabricating a thermoelectric device, the method comprising:
    providing a substrate having a plurality of inclined growth surfaces protruding from a surface thereof, wherein the inclined growth surfaces are tilted at an angle of about 45 degrees or less relative to a direction perpendicular to the surface of the substrate; and
    growing respective thermoelectric material layers on the inclined growth surfaces to define separate growth sites thereon,
    wherein the respective thermoelectric material layers on adjacent ones of the inclined growth surfaces coalesce to collectively define a continuous thermoelectric film.

2. The method of claim 1, wherein a surface of the thermoelectric film opposite the surface of the substrate is substantially planar.

3. The method of claim 2, wherein the thermoelectric film has a crystallographic orientation that is tilted at an angle of about 45 degrees or less relative to a direction along a thickness defined between the surface of the thermoelectric film opposite the surface of the substrate and an opposing surface of the thermoelectric film adjacent the surface of the substrate.

4. The method of claim 3, wherein a plane defined by the crystallographic orientation of the thermoelectric film includes a direction of lowest resistivity in the thermoelectric film.

5. The method of claim 3, wherein a plane defined by the crystallographic orientation of the thermoelectric film includes a lowest pK product in the thermoelectric film.

6. The method of claim 3, wherein a plane defined by the crystallographic orientation of the thermoelectric film includes a highest ZT in the thermoelectric film.

7. The method of claim 3, wherein the thermoelectric film has a thickness of less than about 100 micrometers.

8. The method of claim 3, wherein the thermoelectric film has a thickness of less than about 50 micrometers.

9. The method of claim 3, wherein the thermoelectric film has a thickness of less than about 35 micrometers.

10. The method of claim 2, further comprising the following after epitaxially growing the respective thermoelectric material layers on the inclined growth surfaces:
    removing the substrate such that a surface of the thermoelectric film opposite the substantially planar surface thereof includes a plurality of inclined features protruding therefrom.

11. The method of claim 2, further comprising:
    assembling the thermoelectric film between first and second thermally conductive headers to define a path of thermal and/or electrical conduction between the substantially planar surface and the surface opposite thereto.

12. The method of claim 2, further comprising:
    polishing the thermoelectric film to define the substantially planar surface thereof.

13. The method of claim 1, wherein the inclined growth surfaces define triangular features and wherein the inclined growth surfaces are not perpendicular to the surface of the substrate.

14. The method of claim 1, wherein the thermoelectric film includes a plurality of non-uniform crystallographic orientations, and wherein at least half of the plurality of orientations are tilted at respective angles of about 45 degrees or less relative to a direction along a thickness of the thermoelectric film defined between a surface of the thermoelectric film opposite the surface of the substrate and an opposing surface of the thermoelectric film adjacent the surface of the substrate.

15. The method of claim 1, wherein the thermoelectric film includes a plurality of substantially uniform crystallographic orientations that are tilted at respective angles of about 45 degrees or less relative to a direction along a thickness of the thermoelectric film defined between a surface of the thermoelectric film opposite the surface of the substrate and an opposing surface of the thermoelectric film adjacent the surface of the substrate.

16. The method of claim 15, wherein growing the respective thermoelectric material layers comprises selectively growing the respective thermoelectric material layers on ones of the inclined growth surfaces that are substantially parallel to one another.

17. The method of claim 16, wherein a crystallographic orientation of the surface of the substrate defines a {100} plane, and wherein the trenches extend in a direction substantially parallel to an <010> direction.

18. The method of claim 1, wherein adjacent ones of the inclined growth surfaces define opposing sidewalls of respective trenches in the surface of the substrate.

19. The method of claim 18, wherein providing the substrate comprises:
    etching the surface of the substrate using a dry etchant to define preliminary trenches therein; and then
    etching the preliminary trenches using a wet etchant comprising an isotropic component to define the respective trenches.

20. The method of claim 1, further comprising:
    depositing an intermediate material layer on the inclined growth surfaces prior to growing the respective thermoelectric material layers thereon, wherein the intermediate material layer is different than the substrate and/or the thermoelectric material layers.

21. The method of claim 20, wherein the intermediate material layer has a thickness of between about 10 Angstroms (Å) and about 500 Å, and/or wherein the thickness of the intermediate layer is varied to induce tilted facets.

22. The method of claim 20, wherein the intermediate material layer comprises chromium (Cr), copper (Cu), gold (Au), iridium (Ir), iron (Fe), nickel (Ni), niobium (Nb), palladium (Pd), platinum (Pt), silver (Ag), tantalum (Ta), titanium (Ti), tungsten (W), and/or alloys thereof.

23. The method of claim 1, wherein the inclined growth surfaces are non-orthogonal to the surface of the substrate and define triangular peaks that protrude from the surface of the substrate by about 0.1 micrometers or more.

24. The method of claim 23, wherein a pitch between adjacent ones of the triangular peaks is about 0.1 micrometers to about 10 micrometers.

25. The method of claim 1, wherein the thermoelectric film comprises a Group V-VI material, a Group III-V material, and/or a Group II-VI material having anisotropic thermoelectric properties.

26. The method of claim 25, wherein the thermoelectric film is a compound comprising bismuth (Bi), antimony (Sb), lead (Pb), tellurium (Te), and/or selenium (Se).

27. The method of claim 25, wherein the substrate comprises silicon (Si), gallium arsenide (GaAs), barium fluoride (BaF), silicon carbide (SiC), gallium nitride (GaN), aluminum nitride (AlN), sapphire, and/or glass.

* * * * *